United States Patent
Sasaki

(10) Patent No.: US 7,118,846 B2
(45) Date of Patent: Oct. 10, 2006

(54) POSITIVE RESIST COMPOSITION AND METHOD OF FORMING A RESIST PATTERN USING THE SAME

(75) Inventor: Tomoya Sasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 153 days.

(21) Appl. No.: 10/796,083

(22) Filed: Mar. 10, 2004

(65) Prior Publication Data

US 2006/0035165 A1    Feb. 16, 2006

(30) Foreign Application Priority Data

Mar. 12, 2003    (JP)    ............ P.2003-067010

(51) Int. Cl.
G03C 1/73    (2006.01)
G03F 7/039    (2006.01)
G03F 7/20    (2006.01)
G03F 7/30    (2006.01)

(52) U.S. Cl. .......... 430/270.1; 430/907; 430/906; 430/910; 430/914; 430/326

(58) Field of Classification Search ............ 430/270.1, 430/326, 905, 906, 907, 910, 914
See application file for complete search history.

(56) References Cited

U.S. PATENT DOCUMENTS 6,013,411 A * 1/2000 Aoai et al. ............... 430/270.1
6,939,662 B1 * 9/2005 Mizutani et al. ......... 430/270.1
2001/0041300 A1 * 11/2001 Kodama et al. ............ 430/170
2002/0155376 A1    10/2002 Hashimoto et al.

FOREIGN PATENT DOCUMENTS

| EP | 1 341 038 A | 9/2003 |
| EP | 1 367 440 A2 | 12/2003 |
| JP | 2002-322217 A | 11/2002 |
| WO | WO 00/17712 A1 | 3/2000 |
| WO | WO 00/67072 A1 | 11/2000 |

OTHER PUBLICATIONS

Shintaro Yamada et al., "Design and Study of Resist Materials for 157nm Lithography", Advances in Resist Technology and Processing XX. Theodore H. Fedynyshyn, Proceedings of SPIE vol. 5039 (2003), pp. 569-579.
Partial European Search Report dated Sep. 2, 2004.
European Search Report dated May 6, 2005.

* cited by examiner

Primary Examiner—Sin Lee
(74) Attorney, Agent, or Firm—Sughrue Mion, PLLC

(57) ABSTRACT

A positive resist composition comprises (A) a resin comprising specific repeating units and coming to have enhanced solubility in an alkaline developing solution by the action of an acid and (B) a compound generating an acid by the action of actinic rays or a radiation.

15 Claims, No Drawings

POSITIVE RESIST COMPOSITION AND METHOD OF FORMING A RESIST PATTERN USING THE SAME

BACKGROUND OF THE INVENTION

1. Field of the Invention

The present invention relates to a positive resist composition suitable for use in microlithography processes such as the production of ULSIs or high-capacity microchips and in other photofabrication processes. More particularly, the invention relates to a positive resist composition capable of forming a high-resolution pattern with a vacuum ultraviolet light having a wavelength of 160 nm or shorter. The present invention also relates to a method of forming a resist pattern using the positive resist composition.

2. Description of the Related Art

The degree of integration in integrated circuits is increasing more and more, and it has become necessary to form an ultrafine pattern having a line width of a quarter micrometer or smaller in the production of semiconductor substrates for ULSIs or the like. One of the known techniques for enhancing the fineness of such patterns is to use an exposure light having a shorter wavelength in resist pattern formation.

For example, in the production of semiconductor elements having an integration degree of up to 64 megabits, the i-line (365 nm) from a high-pressure mercury lamp has hitherto been used as an exposure light. Many compositions comprising a novolak resin and a naphthoquinonediazide compound as a photosensitive substance have been developed as positive resists for use with the exposure light, and have given sufficient results in forming patterns having line widths down to about 0.3 µm. On the other hand, in the production of semiconductor elements having an integration degree of 256 megabits or higher, KrF excimer laser light (248 nm) has been used as an exposure light in place of the i-line.

Furthermore, use of ArF excimer laser light (193 nm), which is an exposure light having an even shorter wavelength, and use of $F_2$ excimer laser light (157 nm) for forming a pattern having a line width of 0.1 µm or smaller are recently being investigated for the purpose of producing semiconductor elements having an integration degree of 1 gigabit or higher.

With the use of such exposure lights having shorter wavelengths, the components of resist materials and the structures of compounds for use therein are changing considerably.

A so-called chemical amplification type resist has been developed as a resist composition for exposure to KrF excimer laser light. This composition comprises a combination of: a resin, as the main component, having a poly(hydroxystyrene) backbone which shows reduced absorption in a 248 nm region and is protected by acid-dissociable groups; and a compound which generates an acid upon irradiation with far ultraviolet light (photo-acid generator).

Furthermore, another chemical amplification type resist has been developed as a resist composition for exposure to ArF excimer laser light (193 nm). This composition contains an acid-decomposable resin which has, incorporated in the polymer main chain or side chains thereof, alicyclic structures showing no absorption at 193 nm.

With respect to use with $F_2$ excimer laser light (157 nm), even the alicyclic resin shown above was found to be insufficient in obtaining a desired pattern of 0.1 µm or finer because the resin shows considerable absorption in a 157 nm region. Under these circumstances, a resin having fluorine atoms (perfluorinated structure) incorporated therein was reported to have sufficient transparency at 157 nm, in *Proceedings of the Society of Photo-Optical Instrumentation Engineers (Proc. SPIE)*, Vol. 3678, p. 13 (1999). Effective structures of such fluororesins are proposed in *Proceedings of the Society of Photo-Optical Instrumentation Engineers (Proc. SPIE)*, Vol. 3999, p. 330 (2000), *Proceedings of the Society of Photo-Optical Instrumentation Engineers (Proc. SPIE)*, Vol. 3999, p. 357 (2000), *Proceedings of the Society of Photo-Optical Instrumentation Engineers (Proc. SPIE)*, Vol. 3999, p. 365 (2000), and WO-00/17712, pamphlet. Resist compositions containing a fluorine-containing resin have been investigated.

However, none of those resists satisfies various performances including transparency at 157 nm, sensitivity, and resolution. Those resists have further had a problem that they show poor evenness of application and poor resistance to dry etching.

SUMMARY OF THE INVENTION

Accordingly, an object of the invention is to provide a positive resist composition and a method of forming a resist pattern using the same, the positive resist composition being suitable for use with an exposure light having a wavelength of 160 nm or shorter, in particular, $F_2$ excimer laser light (157 nm). Specifically, the object is to provide a positive resist composition which is sufficiently transparent to the exposure light having a wavelength of 157 nm and is excellent in evenness of application, resistance to dry etching, line edge roughness diminution, and developability.

The present inventors made intensive investigations in view of the properties described above. As a result, they have found that the object of the invention is successfully accomplished by using the following specific compositions. The invention has been thus achieved.

The invention has the following constitutions.

(1)

A positive resist composition comprising:
(A) a resin which comprises a repeating unit having at least two groups represented by the following general formula (Z) and at least one kind of repeating units selected from repeating units represented by the following general formulae (II) to (VI), the resin increasing the solubility in an alkaline developing solution by the action of an acid; and
(B) at least one compound which generates an acid by the action of actinic rays or a radiation:

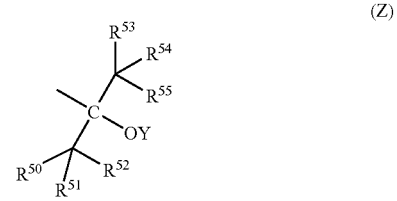

in general formula (Z), $R^{50}$ to $R^{55}$ each independently represent a hydrogen atom, a fluorine atom, or an alkyl group, provided that at least one of $R^{50}$ to $R^{55}$ is either a fluorine atom or an alkyl group in which at least one of the hydrogen atoms has been replaced by a fluorine atom, and Y's each independently represent a hydrogen atom or an organic group;

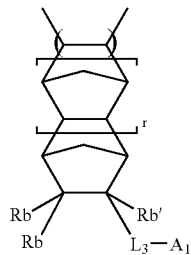

(II)

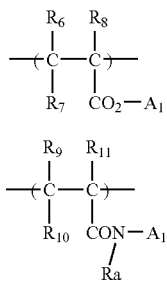

(III)

(IV)

in general formula (II),
Rb and Rb' each independently represent a hydrogen atom, a halogen atom, or an organic group,
$L_3$ represents a single bond or a bivalent connecting group,
$A_1$ represents a partial structure represented by the following general formula ($A_1$), and
r represents 0 or 1;
in general formula (III),
$R_6$ to $R_8$ each independently represent a hydrogen atom, a fluorine atom, a chlorine atom, a cyano group, or an alkyl group in which at least one of the hydrogen atoms has been replaced by a fluorine atom, provided that at least one of $R_6$ to $R_8$ is not a hydrogen atom, and
$A_1$ represents a partial structure represented by the following general formula ($A_1$);
in general formula (IV),
$R_9$ to $R_{11}$ each independently represent a hydrogen atom, a fluorine atom, a chlorine atom, a cyano group, or an alkyl group in which at least one of the hydrogen atoms has been replaced by a fluorine atom, provided that at least one of $R_9$ to $R_{11}$ is not a hydrogen atom,
Ra represents a hydrogen atom, an alkyl group, a cycloalkyl group, an aryl group, or an aralkyl group, and
$A_1$ represents a partial structure represented by the following general formula ($A_1$);

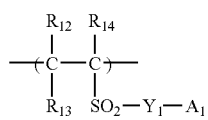

(V)

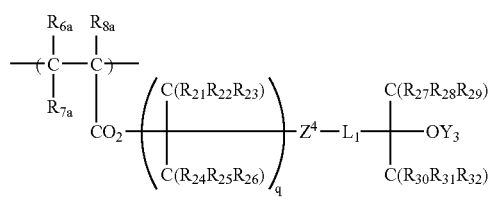

(VI)

in general formula (V),
$R_{12}$ to $R_{14}$ each independently represent a hydrogen atom, a fluorine atom, a chlorine atom, a cyano group, or an alkyl group in which at least one of the hydrogen atoms has been replaced by a fluorine atom,
$Y_1$ represents a single bond, —O—, or —N(Ra)—, wherein Ra represents a hydrogen atom, an alkyl group, a cycloalkyl group, an aryl group, or an aralkyl group, and
$A_1$ represents a partial structure represented by the following general formula ($A_1$);
in general formula (VI),
$R_{6a}$ to $R_{8a}$ each independently represent a hydrogen atom, a fluorine atom, a chlorine atom, a cyano group, or an alkyl group in which at least one of the hydrogen atoms has been replaced by a fluorine atom, provided that at least one of $R_{6a}$ to $R_{8a}$ is not a hydrogen atom,
$R_{21}$ to $R_{26}$ each independently represent a hydrogen atom, a fluorine atom, or an alkyl group, provided that at least one of $R_{21}$ to $R_{26}$ is a fluorine atom,
$R_{27}$ to $R_{32}$ each independently represent a hydrogen atom, a fluorine atom, or an alkyl group, provided that at least one of $R_{27}$ to $R_{32}$ is a fluorine atom,
$Z_4$ represents a phenylene group, a cyclohexylene group, an adamantane residue, or a norbornane residue,
$Y_3$ represents a hydrogen atom or an organic group,
$L_1$ represents a single bond or a bivalent connecting group, and
q represents 0 or 1; and

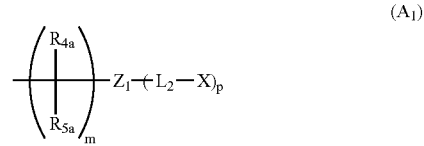

($A_1$)

in general formula ($A_1$),
$R_{4a}$ and $R_{5a}$ each independently represent an alkyl group,
$Z_1$ represents an alicyclic hydrocarbon group having a valence of p+1,
$L_2$ represents a single bond or a bivalent connecting group,
X represents a hydroxy group, a cyano group, an alkoxy group, or an alkyl group, provided that at least one of the X's is not an alkyl group,
when two or more $L_2$'s and two or more X's are present in the partial structure, the $L_2$'s and the X's each may be the same or different,
m represents 0 or 1, and
p represents an integer of 1 to 4.
(2) The positive resist composition as described in (1) above wherein the repeating units having at least two groups represented by general formula (Z) are repeating units represented by the following general formula (I):

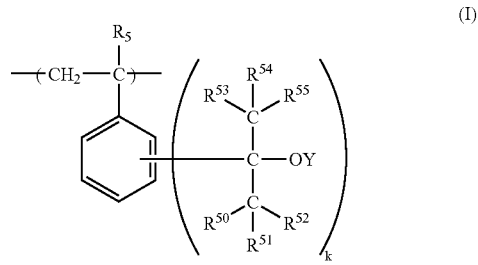

(I)

in general formula (I),
$R_5$ represents a hydrogen atom, a halogen atom, a cyano group, or an alkyl group, $R^{50}$'s to $R^{55}$'s each independently represent a hydrogen atom, a fluorine atom, or an alkyl group, provided that at least one of $R^{50}$ to $R^{55}$ is either a fluorine atom or an alkyl group in which at least one of the hydrogen atoms has been replaced by a fluorine atom, Y's each independently represent a hydrogen atom or an organic group, and k represents an integer of $2 \leq k \leq 5$.

(3)

The positive resist composition as described in (1) or (2) above wherein at least one X in the formula ($A_1$) is a group having a hydroxy group.

(4)

The positive resist composition as described in any one of (1) to (3) above wherein the resin (A) further contains at least one of repeating units represented by the following formula (VIII) and repeating units represented by the following formula (IX):

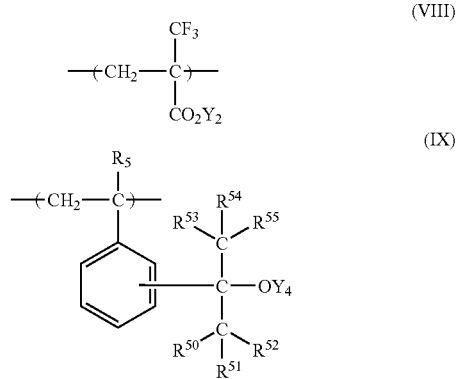

in general formula (VIII), $Y_2$ represents a hydrogen atom or an organic group; and in general formula (IX), $R_5$ represents a hydrogen atom, a halogen atom, a cyano group, or an alkyl group, $R^{50}$ to $R^{55}$ each independently represent a hydrogen atom, a fluorine atom, or an alkyl group, provided that at least one of $R^{50}$ to $R^{55}$ is a fluorine atom or an alkyl group in which at least one of the hydrogen atoms has been replaced by a fluorine atom, and $Y_4$ represents a hydrogen atom or an organic group.

(5) The positive resist composition as described in any one of (1) to (4) above wherein $Z_1$ in the formula ($A_1$) is an adamantyl group or a norbornane residue.

(6) The positive resist composition as described in any one of (2) to (5) above wherein k in formula (I) is 2.

(7) The positive resist composition as described in any one of (1) to (6) above wherein Rb' in formula (II), $R_8$ in formula (III), or $R_{11}$ in formula (IV) is a trifluoromethyl group.

(8) The positive resist composition as described in any one of (1) to (7) above which further contains (X) a non-polymeric dissolution inhibitor.

(9) The positive resist composition as described in any one of (1) to (8) above wherein the compound (B) comprises (B1) at least one compound which generates an organic sulfonic acid by the action of actinic rays or a radiation.

(10) The positive resist composition as described in (9) above wherein the compound (B1) comprises at least one compound which generates an organic sulfonic acid containing at least one fluorine atom by the action of actinic rays or a radiation and at least one compound which generates an organic sulfonic acid containing no fluorine atom by the action of actinic rays or a radiation.

(11) The positive resist composition as described in (9) or (10) above wherein the compound (B) further contains (B2) a compound which generates a carboxylic acid by the action of actinic rays or a radiation.

(12) The positive resist composition as described in any one of (1) to (11) above which further contains (E) an organic basic compound.

(13) The positive resist composition as described in any one of (1) to (12) above which further contains (D) a surfactant.

(14) A method of forming a resist pattern comprising: coating the positive resist composition as described in any one of (1) to (13) on a substrate; irradiating a resultant coating with actinic rays or a radiation; and developing the resultant coating.

DETAILED DESCRIPTION OF THE INVENTION

The compounds to be used in the composition of the invention will be explained below in detail.

[1] Resin (a) Coming to have Enhanced Solubility in Alkaline Developing Solution by the Action of Acid Resin (A) in the invention comprises repeating units having groups represented by formula (Z) and at least one kind of repeating units selected from repeating units represented by formulae (II) to (VI), and is a resin which comes to have enhanced solubility in an alkaline developing solution by the action of an acid. This resin has groups (acid-dissociable groups) which dissociate by the action of an acid to yield alkali-soluble groups (e.g., hydroxy or carboxyl groups). However, besides the repeating units having groups represented by formula (Z), any repeating units contained in resin (A) may have an acid-dissociable group.

In resin (A), the repeating units having groups represented by formula (Z) preferably are repeating units represented by general formula (I).

Resin (A) preferably further contains at least either of repeating units represented by formula (VIII) and repeating units represented by formula (IX).

In general formulae (Z) and (I), $R_5$ represents a hydrogen atom, a halogen atom, a cyano group, or an alkyl group.

$R^{50}$ to $R^{55}$ each independently represent a hydrogen atom, a fluorine atom, or an alkyl group, provided that at least one of $R^{50}$ to $R^{55}$ is either a fluorine atom or an alkyl group in which at least one of the hydrogen atoms has been replaced by a fluorine atom. In the resin (A) comprising a repeating unit having at least two groups represented by the general formula (Z), a plurality of $R^{50}$'s may be same or different each other, a plurality of $R^{51}$'s may be same or different each other, a plurality of $R^{52}$'s may be same or different each other, a plurality of $R^{53}$'s may be same or different each other, a plurality of $R^{54}$'s may be same or different each other and a plurality of $R^{55}$'s may be same or different each other.

Y's each independently represent a hydrogen atom or an organic group, which may be an acid-dissociable organic group (acid-dissociable group) or a non-acid-dissociable organic group.

Symbol k represents an integer of $2 \leq k \leq 5$.

Examples of the alkyl groups represented by $R_5$ and $R^{50}$ to $R^{55}$ include linear and branched alkyl groups which may have one or more substituents. For example, these are alkyl groups having 1 to 8 carbon atoms. Preferred examples thereof include methyl, ethyl, propyl, n-butyl, sec-butyl, hexyl, 2-ethylhexyl, and octyl. Examples of the substituents which may be possessed include halogen atoms, hydroxy, cyano, and carboxyl. Preferred is a fluorine atom.

Symbol k preferably is 2 or 3, especially preferably 2.

The acid-dissociable group represented by Y is not limited as long as it dissociates by the action of an acid to form a hydrophilic group, e.g., hydroxy or carboxyl, and thereby enhance solubility in an alkaline developing solution. Examples thereof include —C($R_{11a}$) ($R_{12a}$) ($R_{13a}$), —C($R_{14a}$) ($R_{15a}$) (O$R_{16a}$), and —COO—C($R_{11a}$) ($R_{12a}$) ($R_{13a}$).

$R_{11a}$ to $R_{13a}$ and $R_{16a}$ each independently represent an alkyl, cycloalkyl, alkenyl, aralkyl, or aryl group which may have one or more substituents.

$R_{14a}$ and $R_{15a}$ each independently represent a hydrogen atom or an alkyl group which may have one or more substituents.

Two of $R_{11a}$, $R_{12a}$, and $R_{13a}$ may be bonded to each other to form a ring, and two of $R_{14a}$, $R_{15a}$, and $R_{16a}$ may be bonded to each other to form a ring.

The alkyl groups represented by $R_{11a}$ to $R_{13a}$, $R_{14a}$, $R_{15a}$, and $R_{16a}$ preferably are alkyl groups having 1 to 8 carbon atoms. Examples thereof include methyl, ethyl, propyl, n-butyl, sec-butyl, hexyl, 2-ethylhexyl, and octyl.

The cycloalkyl groups represented by $R_{11a}$ to $R_{13a}$ and $R_{16a}$ may be monocyclic or polycyclic. The monocyclic groups preferably are cycloalkyl groups having 3 to 8 carbon atoms, and examples thereof include cyclopropyl, cyclopentyl, cyclohexyl, cyclobutyl, and cyclooctyl. The polycyclic groups preferably are cycloalkyl groups having 6 to 20 carbon atoms, and examples thereof include adamantyl, norbornyl, isobornyl, camphanyl, dicyclopentyl, α-pinel, tricyclodecanyl, tetracyclododecyl, and androstanyl. In the cycloalkyl groups, part of the carbon atoms may have been replaced by a heteroatom, e.g., oxygen atom.

The aryl groups represented by $R_{11a}$ to $R_{13a}$ and $R_{16a}$ preferably are aryl groups having 6 to 10 carbon atoms. Examples thereof include phenyl, tolyl, dimethylphenyl, 2,4,6-trimethylphenyl, naphthyl, anthryl, and 9,10-dimethoxyanthryl.

The aralkyl groups represented by $R_{11a}$ to $R_{13a}$ and $R_{16a}$ preferably are aralkyl groups having 7 to 12 carbon atoms. Examples thereof include benzyl, phenethyl, and naphthylmethyl.

The alkenyl groups represented by $R_{11a}$ to $R_{13a}$ and $R_{16a}$ preferably are alkenyl groups having 2 to 8 carbon atoms. Examples thereof include vinyl, allyl, butenyl, and cyclohexenyl.

Examples of the substituents which may be possessed by $R_{11a}$ to $R_{13a}$, $R_{14a}$, $R_{15a}$, and $R_{16a}$ include alkyl groups, cycloalkyl groups, aryl groups, amino, amide, ureido, urethane, hydroxy, carboxy, halogen atoms, alkoxy groups, thioether groups, acyl groups, acyloxy groups, alkoxycarbonyl groups, cyano, and nitro.

Preferred examples of the acid-dissociable group include tertiary alkyl groups such as t-butyl, t-amyl, 1-alkyl-1-cyclohexyl groups, 2-alkyl-2-adamantyl groups, 2-adamantyl-2-propyl groups, and 2-(4-methylcyclohexyl)-2-propyl, acetal groups such as 1-alkoxy-1-ethoxy groups, 1-alkoxy-1-methoxy groups, and tetrahydropyranyl, t-alkylcarbonyl groups, and t-alkylcarbonylmethyl groups.

The non-acid-dissociable organic group is an organic group which does not dissociate by the action of an acid. Examples thereof include alkyl, aryl, aralkyl, alkoxy, alkoxycarbonyl, amide, and cyano groups which do not dissociate by the action of an acid. The alkyl group preferably is a linear, branched, or cyclic alkyl group having 1 to 10 carbon atoms, and examples thereof include methyl, ethyl, propyl, n-butyl, sec-butyl, hexyl, 2-ethylhexyl, octyl, cyclopropyl, cyclobutyl, cyclohexyl, and adamantyl. The aryl group preferably is an aryl group having 6 to 14 carbon atoms, and examples thereof include phenyl, naphthyl, and anthracenyl. The aralkyl group preferably is an aralkyl group having 6 to 12 carbon atoms, and examples thereof include benzyl, phenethyl, and cumyl. The alkoxy group and the alkoxy group in the alkoxycarbonyl group each preferably are an alkoxy group having 1 to 5 carbon atoms, and examples thereof include methoxy, ethoxy, propoxy, n-butoxy, and isobutoxy. The alkyl, aryl, aralkyl, alkoxy, or alkoxycarbonyl group represented by Y may have one or more substituents such as, e.g., hydroxy.

Examples of the repeating units containing groups represented by general formula (Z) are shown below, but the repeating units in the invention should not be construed as being limited to these examples.

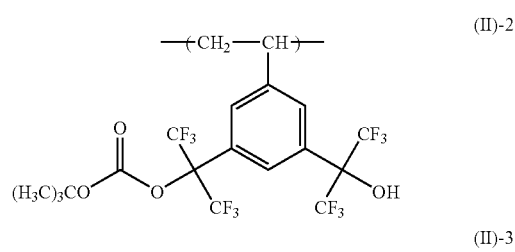

(II)-2

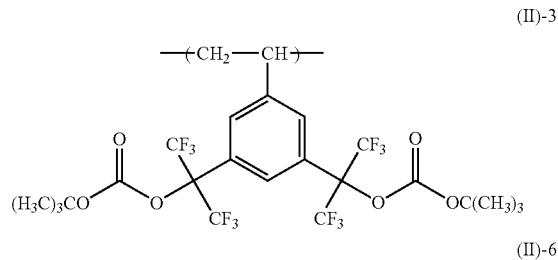

(II)-3

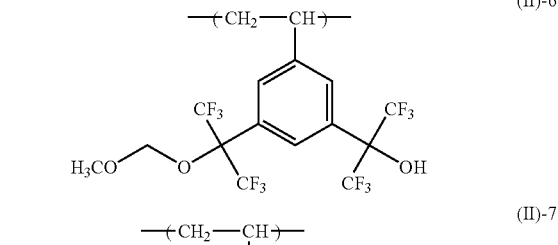

(II)-6

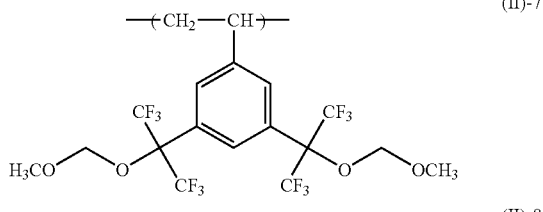

(II)-7

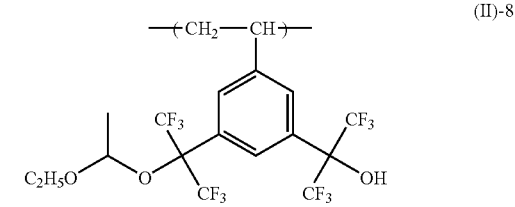

(II)-8

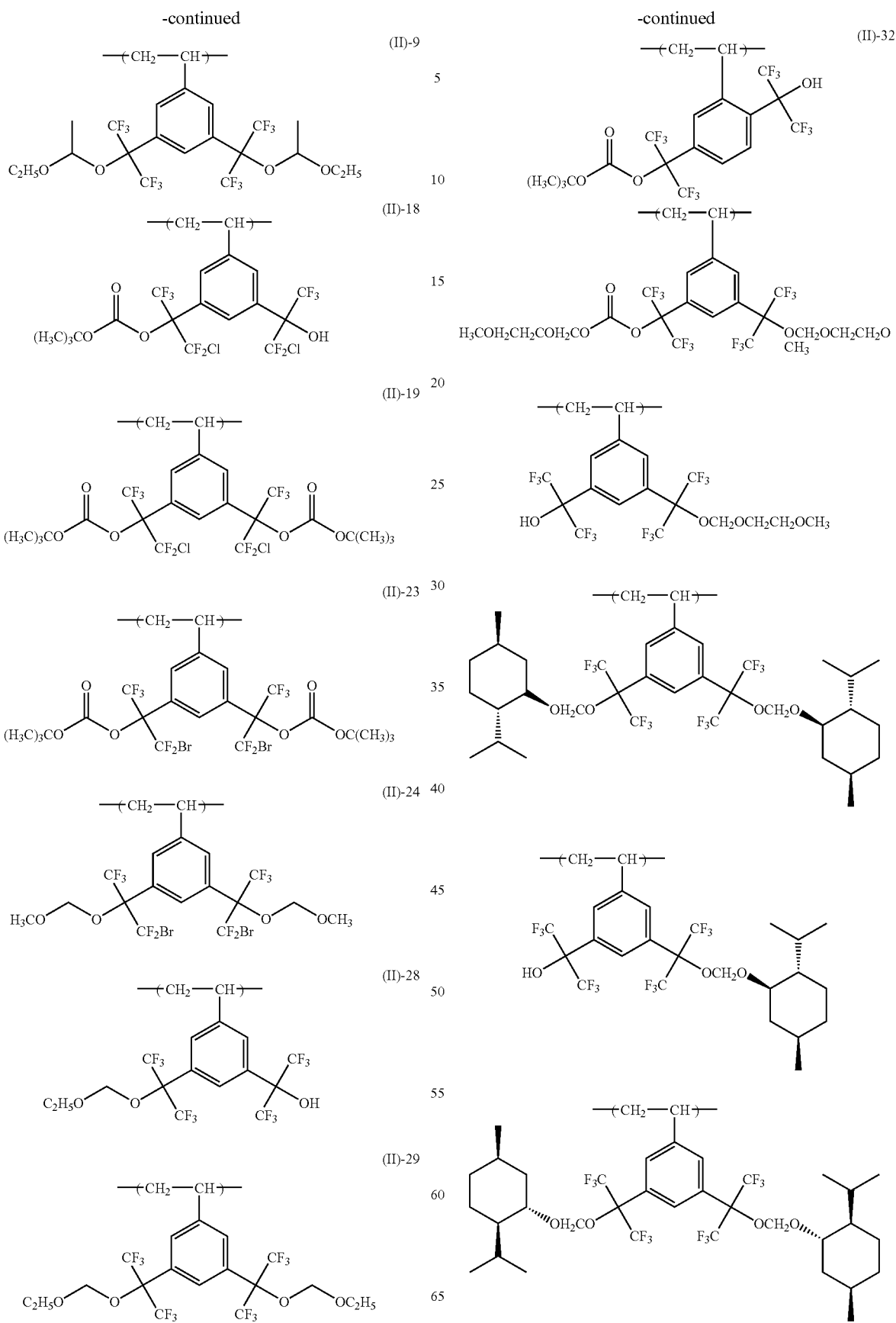

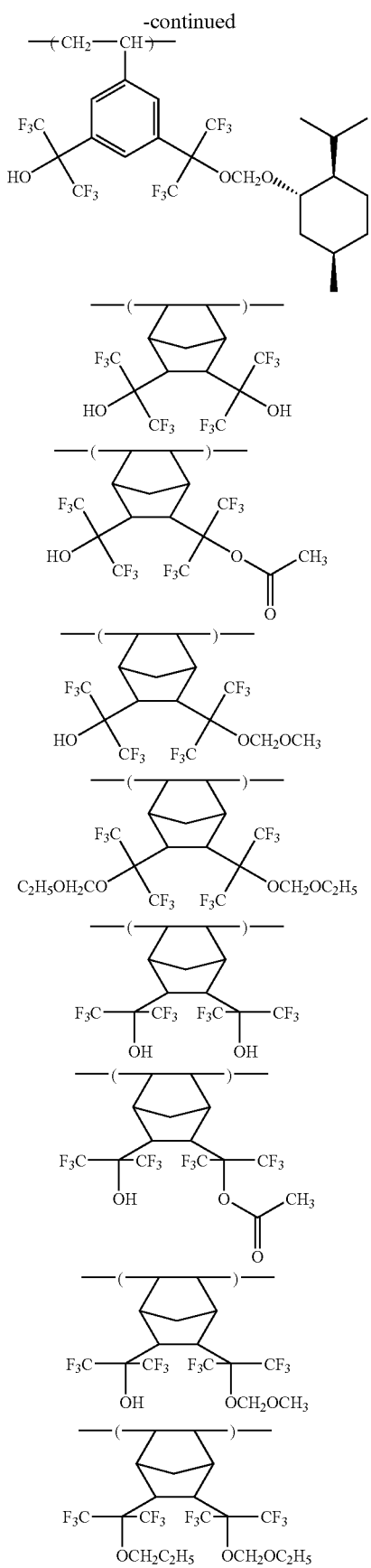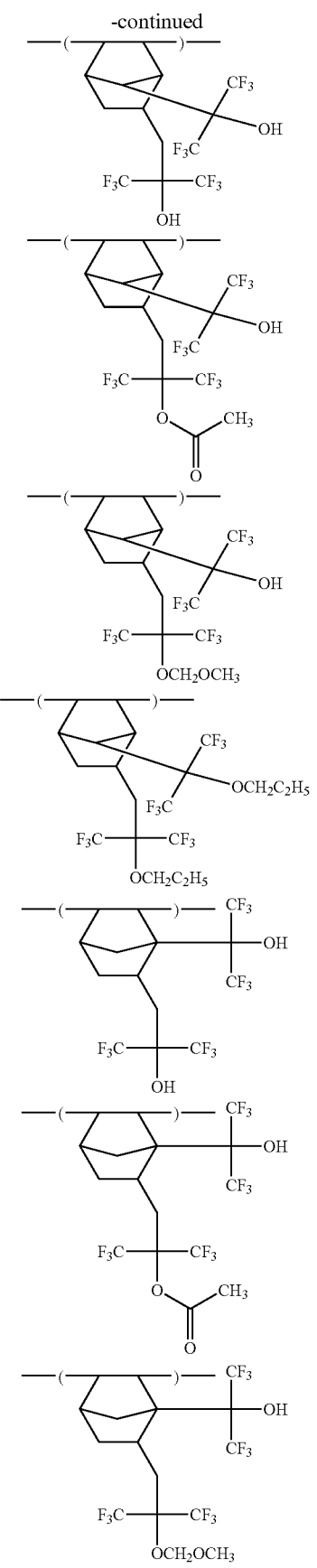

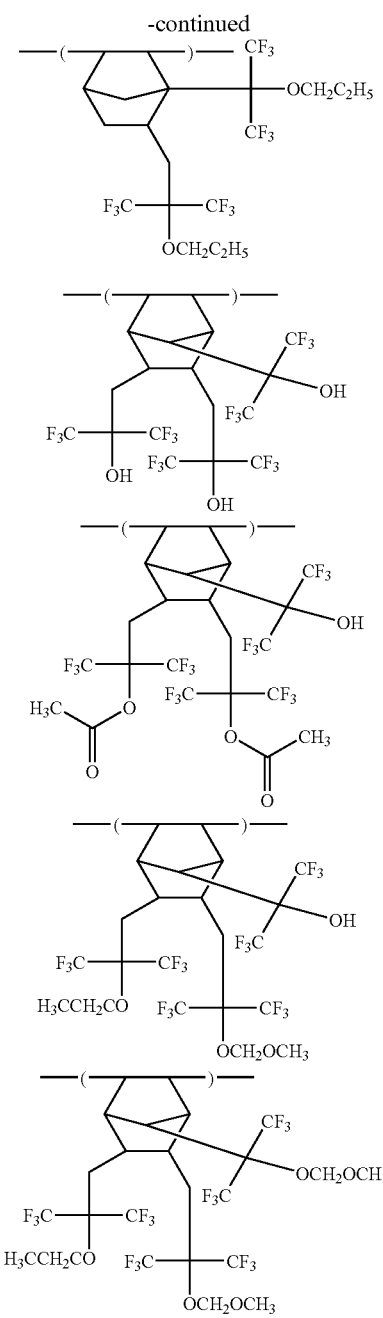

In general formula (II), Rb and Rb' each independently represent a hydrogen atom, a halogen atom, or an organic group. $L_3$ represents a single bond or a bivalent connecting group. $A_1$ represents a partial structure represented by general formula ($A_1$). Symbol r represents 0 or 1.

Examples of the halogen atom represented by Rb and Rb' include fluorine, chlorine, bromine, and iodine atoms.

Examples of the organic group represented by Rb and Rb' include linear, branched, or cyclic alkyl groups, aryl groups, and aralkyl groups each having up to 10 carbon atoms, alkoxycarbonyl groups each having up to 11 carbon atoms in total, amide, alkoxy groups, and cyano. Examples of substituents include halogen atoms, hydroxy, alkoxy groups, and cyano. These substituents may be bonded to any carbon atoms in the organic group.

Preferred examples of Rb and Rb' include a hydrogen atom, fluorine atom, chlorine atom, trifluoroethyl, methoxy, methyl, and ethyl.

Examples of the bivalent connecting group represented by $L_3$ include carbonyloxy, carbonyl, and carbonylamino (amide).

Examples of the repeating units represented by general formula (II) are shown below, but the repeating units in the invention should not be construed as being limited to these examples.

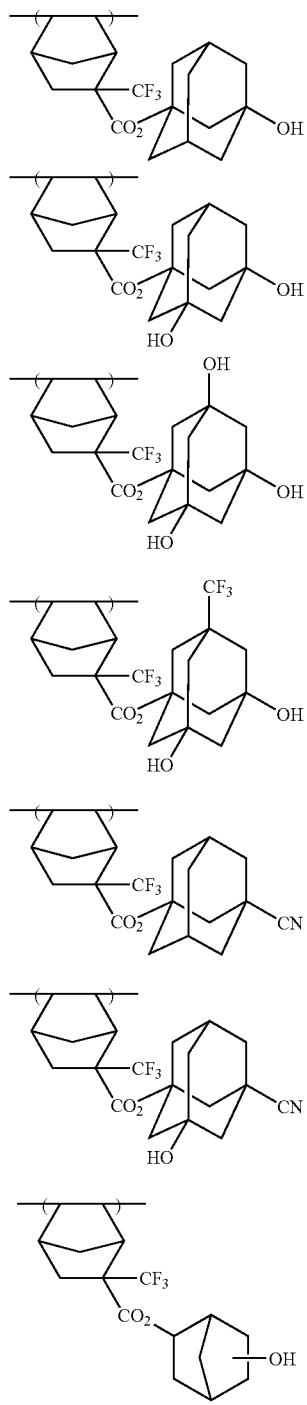

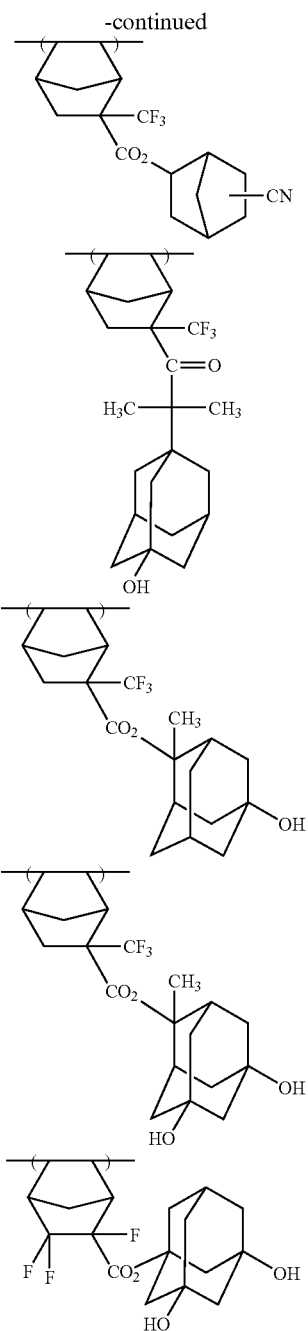

In general formula (III),

R_6 to R_8 each independently represent a hydrogen atom, a fluorine atom, a chlorine atom, a cyano group, or an alkyl group in which at least one of the hydrogen atoms has been replaced by a fluorine atom, provided that at least one of $R_6$ to $R_8$ is not a hydrogen atom; and $A_1$ represents a partial structure represented by general formula ($A_1$).

The alkyl groups represented by $R_6$ to $R_8$ in which at least one of the hydrogen atoms has been replaced by a fluorine atom preferably are linear alkyl groups which have 1 to 3 carbon atoms and in which at least one of the hydrogen atoms has been replaced by a fluorine atom. Examples thereof include perfluoromethyl, difluoromethyl, and fluoromethyl.

Examples of the repeating units represented by general formula (III) are shown below, but the repeating units in the invention should not be construed as being limited to these examples.

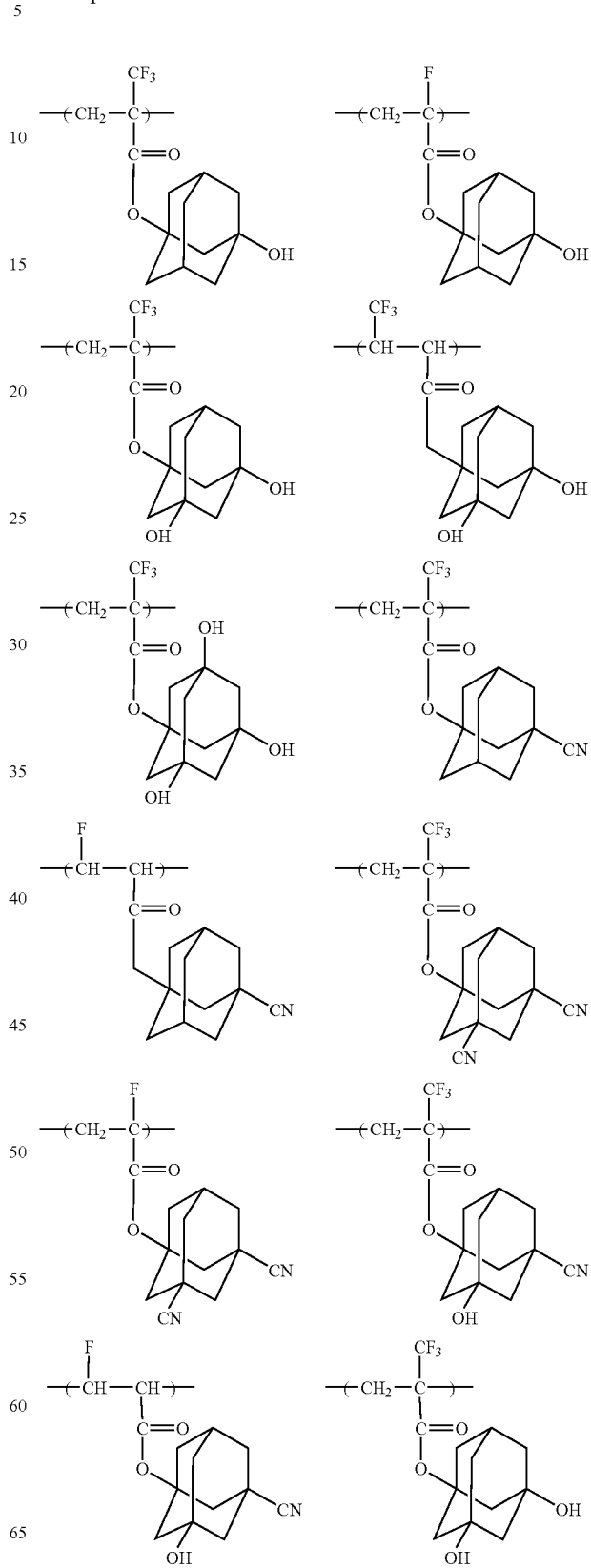

-continued

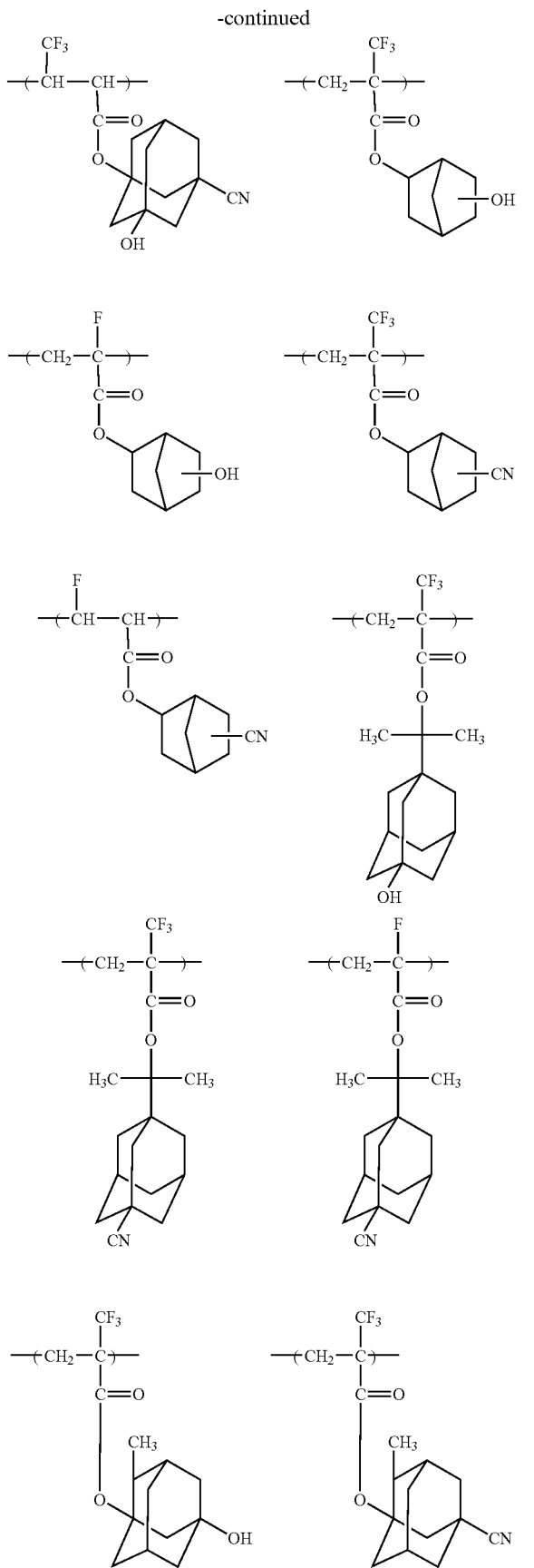

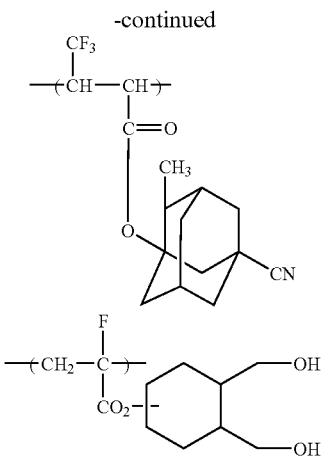

In general formula (IV), $R_9$ to $R_{11}$ each independently represent a hydrogen atom, a fluorine atom, a chlorine atom, a cyano group, or an alkyl group in which at least one of the hydrogen atoms has been replaced by a fluorine atom, provided that at least one of $R_9$ to $R_{11}$ is not a hydrogen atom. Ra represents a hydrogen atom, an alkyl group, a cycloalkyl group, an aryl group, or an aralkyl group. $A_1$ represents a partial structure represented by general formula $(A_1)$.

Examples of $R_9$ to $R_{11}$ are the same as those of $R_6$ to $R_8$ in general formula (III).

The alkyl group represented by Ra preferably is an alkyl group having 1 to 8 carbon atoms. Examples thereof include methyl, ethyl, propyl, n-butyl, sec-butyl, hexyl, 2-ethylhexyl, and octyl.

The cycloalkyl group represented by $R_a$ may be monocyclic or polycyclic. The monocyclic group preferably is a cycloalkyl group having 3 to 8 carbon atoms, and examples thereof include cyclopropyl, cyclopentyl, cyclohexyl, cyclobutyl, and cyclooctyl. The polycyclic group preferably is a cycloalkyl group having 6 to 20 carbon atoms, and examples thereof include adamantyl, norbornyl, isobornyl, camphanyl, dicyclopentyl, α-pinel, tricyclodecanyl, tetracyclododecyl, and androstanyl. In the cycloalkyl group, part of the carbon atoms may have been replaced by a heteroatom, e.g., oxygen atom.

The aryl group represented by $R_a$ preferably is an aryl group having 6 to 10 carbon atoms. Examples thereof include phenyl, tolyl, dimethylphenyl, 2,4,6-trimethylphenyl, naphthyl, anthryl, and 9,10-dimethoxyanthryl.

The aralkyl group represented by $R_a$ preferably is an aralkyl group having 7 to 12 carbon atoms. Examples thereof include benzyl, phenethyl, and naphthylmethyl.

Examples of the substituents which may be possessed by the alkyl, cycloalkyl, aryl, or aralkyl group represented by $R_a$ include alkyl groups, cycloalkyl groups, aryl groups, amino, amide, ureido, urethane, hydroxy, carboxy, halogenatoms, alkoxy groups, thioether groups, acyl groups, acyloxy groups, alkoxycarbonyl groups, cyano, and nitro.

Examples of the repeating units represented by general formula (IV) are shown below, but the repeating units in the invention should not be construed as being limited to these examples.

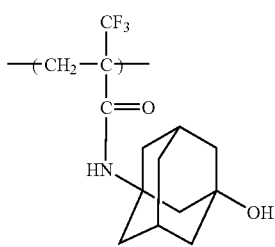 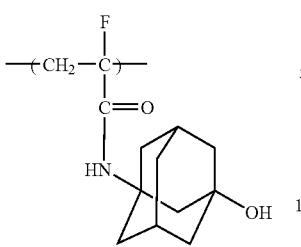 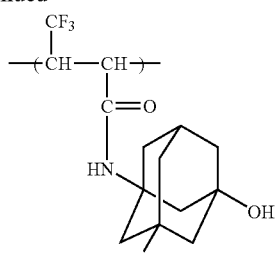

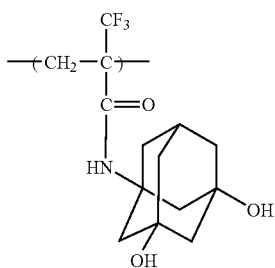 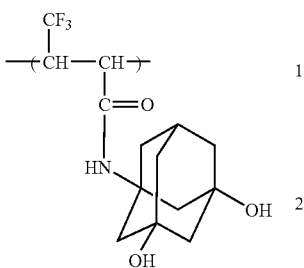 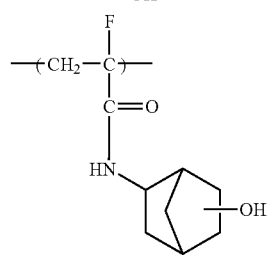

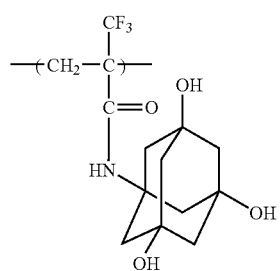 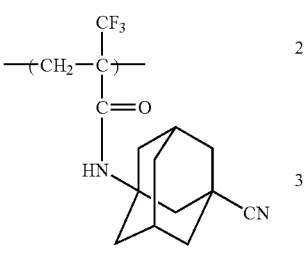 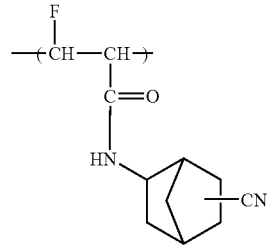

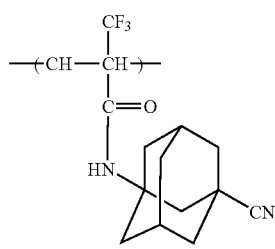 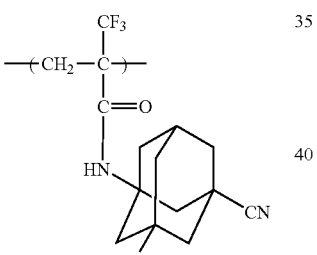

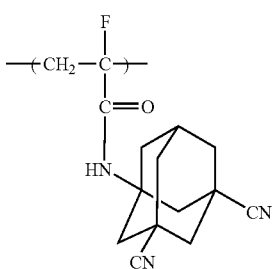 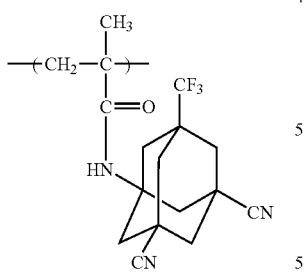

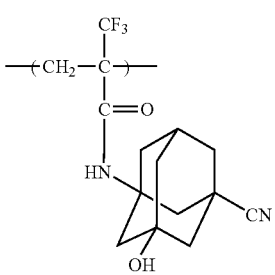 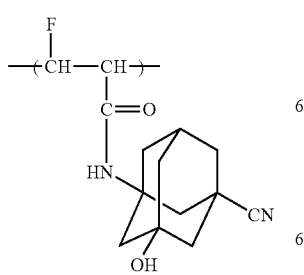

In general formula (V), $R_{12}$ to $R_{14}$ each independently represent a hydrogen atom, a fluorine atom, a chlorine atom, a cyano group, or an alkyl group in which at least one of the hydrogen atoms has been replaced by a fluorine atom. $Y_1$ represents a single bond, —O—, or —N(Ra)—, wherein Ra represents a hydrogen atom, an alkyl group, a cycloalkyl group, an aryl group, or an aralkyl group. $A_1$ represents a partial structure represented by general formula ($A_1$).

Examples of the alkyl groups represented by $R_{12}$ to $R_{14}$ in which at least one of the hydrogen atoms has been replaced by a fluorine atom are the same as those of the alkyl groups represented by $R_6$ to $R_8$ in general formula (III) in which at least one of the hydrogen atoms has been replaced by a fluorine atom.

Examples of Ra in $Y_1$ are the same as those of the Ra in general formula (IV).

Examples of the repeating units represented by general formula (V) are shown below, but the repeating units in the invention should not be construed as being limited to these examples.

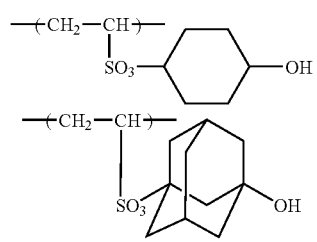

-continued

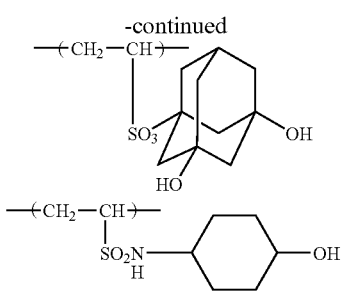

In general formula (VI), $R_{6a}$ to $R_{8a}$ each independently represent a hydrogen atom, a fluorine atom, a chlorine atom, a cyano group, or an alkyl group in which at least one of the hydrogen atoms has been replaced by a fluorine atom, provided that at least one of $R_{6a}$ to $R_{8a}$ is not a hydrogen atom.

$R_{21}$ to $R_{26}$ each independently represent a hydrogen atom, a fluorine atom, or an alkyl group, provided that at least one of $R_{21}$ to $R_{26}$ is a fluorine atom.

$R_{27}$ to $R_{32}$ each independently represent a hydrogen atom, a fluorine atom, or an alkyl group, provided that at least one of $R_{27}$ to $R_{32}$ is a fluorine atom.

$Z_4$ represents a phenylene group, a cyclohexylene group, an adamantane residue, or a norbornane residue.

$Y_3$ represents a hydrogen atom or an organic group.

$L_1$ represents a single bond or a bivalent connecting group.

Symbol q represents 0 or 1.

In general formula (VI), examples of $R_{6a}$ to $R_{8a}$ are the same as those of $R_6$ to $R_8$ in general formula (III). $Y_3$ represents a hydrogen atom or an organic group. Examples of the organic group include the same organic groups as those enumerated above as examples of Y in general formula (Z).

In general formula (VI), $R_{21}$ to $R_{32}$ each represent a hydrogen atom, fluorine atom, or alkyl group which may have one or more substituents, provided that at least one of $R_{21}$ to $R_{26}$ and at least one of $R_{27}$ to $R_{32}$ are fluorine atoms.

Examples of the alkyl groups represented by $R_{21}$ to $R_{32}$ include linear, branched, and cyclic alkyl groups. Specific examples thereof include methyl, ethyl, propyl, isopropyl, butyl, isobutyl, t-butyl, amyl, isoamyl, t-amyl, hexyl, cyclohexyl, octyl, and 2-ethylhexyl.

Examples of the substituents which may be possessed include halogen atoms, hydroxy, alkoxy groups, and cyano. Examples of the halogen atoms include fluorine, chlorine, and bromine atoms. Examples of the alkoxy groups include linear, branched, and cyclic alkoxy groups having generally 1 or more, preferably 1 to 6 carbon atoms. Specific examples thereof include methoxy, ethoxy, propoxy, isopropoxy, butoxy, isobutoxy, and t-butoxy.

$Z_4$ represents a phenylene group, cyclohexylene group, adamantane residue, or norbornane residue.

$L_1$ represents a single bond or a bivalent connecting group. The bivalent connecting group represents one group or a combination of two or more groups selected from the group consisting of substituted or unsubstituted alkylene, substituted or unsubstituted arylene, ether, thioether, carbonyl, ester, amide, sulfonamide, urethane, and urea groups. Examples of the alkylene group represented by or contained in $L_1$ include groups represented by the following formula.

—[C($R_b$)($R_c$)]$_r$—

In the formula, $R_b$ and $R_c$ may be the same or different and each represent a hydrogen atom, alkyl group, substituted alkyl group, halogen atom, hydroxy, or alkoxy group. Preferred examples of the alkyl group include lower alkyl groups such as methyl, ethyl, propyl, isopropyl, and butyl. More preferably, the alkyl group is one selected from methyl, ethyl, propyl, and isopropyl. Examples of the substituent(s) of the substituted alkyl group include hydroxy, halogen atoms, and alkoxy groups (preferably having 1 to 4 carbon atoms). Examples of the alkoxy groups include ones having 1 to 4 carbon atoms, such as methoxy, ethoxy, propoxy, and butoxy. Examples of the halogen atoms include chlorine, bromine, fluorine, and iodine atoms. Symbol r represents an integer of 1 to 10.

$L_1$ especially preferably is a single bond or a methylene group.

Examples of the repeating units represented by general formula (VI) are shown below, but the repeating units in the invention should not be construed as being limited to these examples.

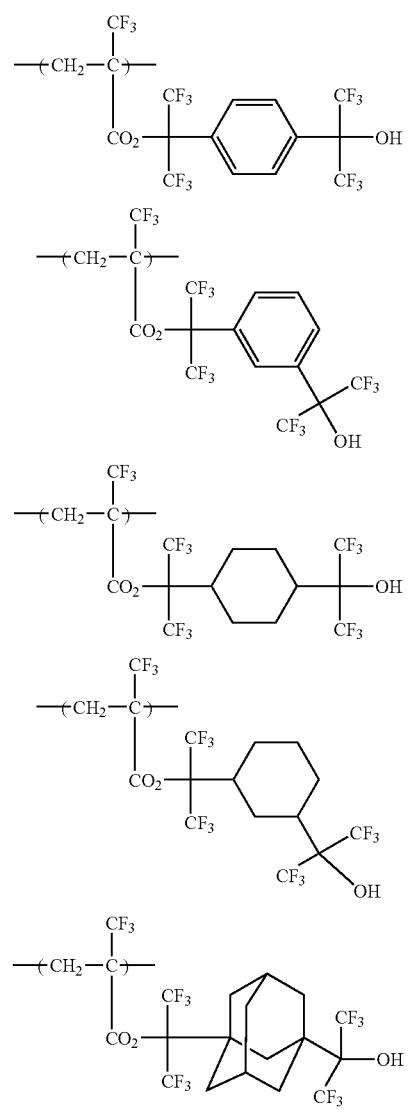

-continued
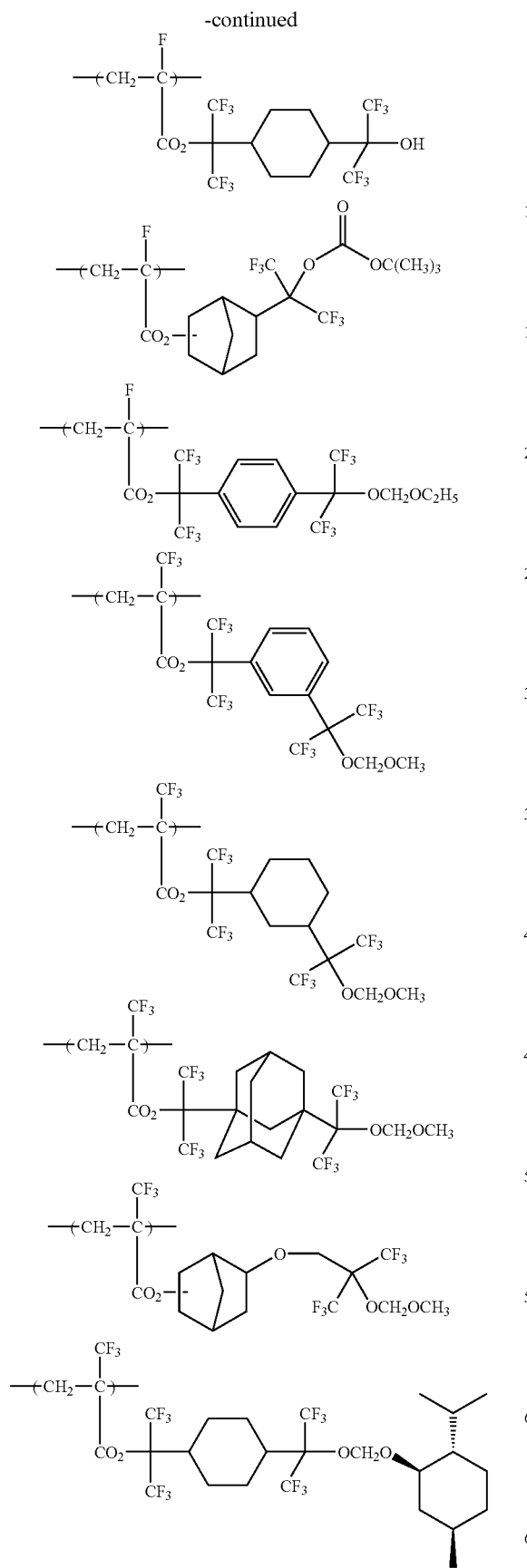
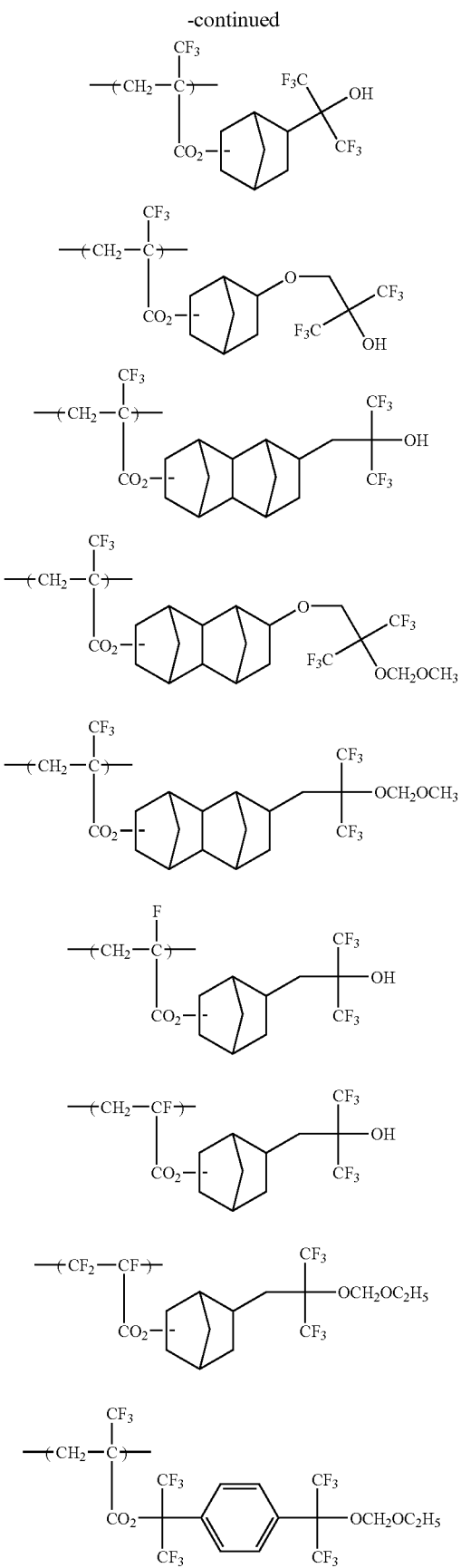

-continued

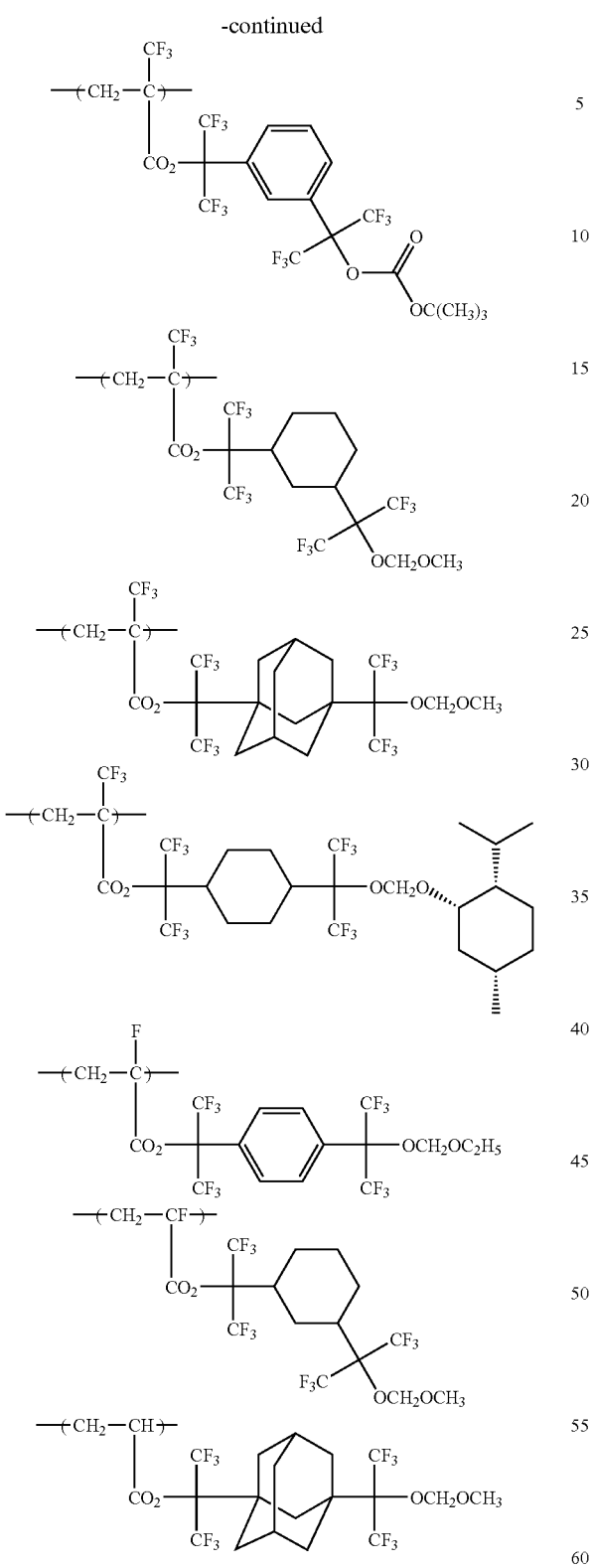

In general formula ($A_1$), $R_{4a}$ and $R_{5a}$ each independently represent an alkyl group. $Z_1$ represents an alicyclic hydrocarbon group having a valence of p+1.

$L_2$ represents a single bond or a bivalent connecting group; when two or more $L_2$'s are present, they each independently represent the bond or group.

X represents a fluorine atom, a chlorine atom, a hydroxy group, a cyano group, an alkoxy group, or an alkyl group; when two or more X's are present, they each independently represent any of those atoms and groups, provided that at least one of the X's is not an alkyl group. Symbol m represents 0 or 1, and p represents an integer of 1 to 4.

The alkyl groups represented by $R_{4a}$ and $R_{5a}$ preferably are alkyl groups having 1 to 8 carbon atoms. Examples thereof include methyl, ethyl, propyl, n-butyl, sec-butyl, hexyl, 2-ethylhexyl, and octyl.

The alkyl groups represented by $R_{4a}$ and $R_{5a}$ may further have one or more substituents selected from, e.g., halogen atoms and cyano.

The alicyclic hydrocarbon group having a valence of p+1 which is represented by $Z_1$ may be monocyclic or polycyclic. Examples thereof include hydrocarbon groups having an alicyclic structure which has 5 or more carbon atoms and is, e.g., a monocyclic, bicyclic, tricyclic, or tetracyclic structure. The number of carbon atoms thereof is preferably from 6 to 30, especially preferably from 7 to 25.

Specific examples of the alicyclic structure are shown below.

(1)

(2)

(3)

(4)

(5)

(6)

(7)

(8)

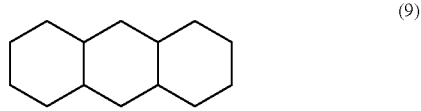

(9)

-continued
(10)
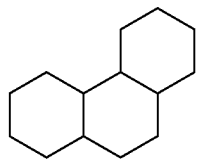
(11)
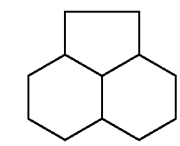
(12)
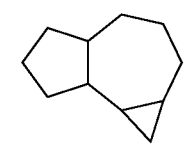
(13)
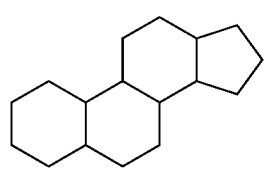
(14)
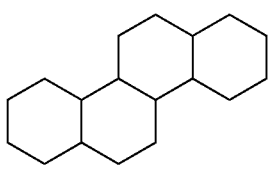
(15)
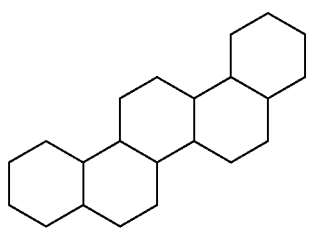
(16)
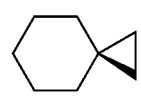
(17)
(18)
(19)
(20)
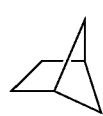
-continued
(21)
(22)
(23)
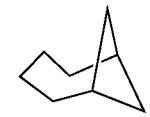
(24)
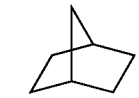
(25)
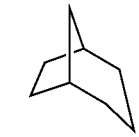
(26)
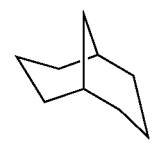
(27)
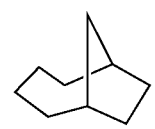
(28)
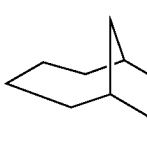
(29)
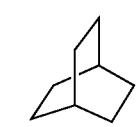
(30)
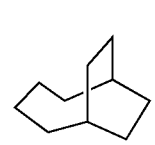
(31)
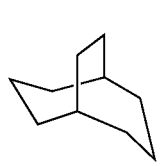
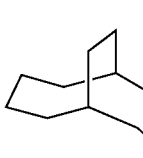

-continued

(32) 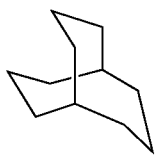

(33) 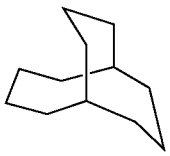

(34) 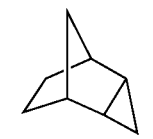

(35) 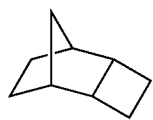

(36) 

(37) 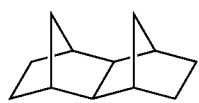

(38) 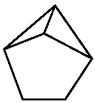

(39) 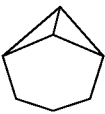

(40) 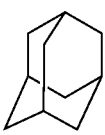

(41) 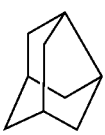

(42) 

-continued

(43) 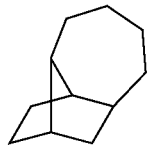

(44) 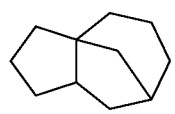

(45) 

(46) 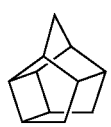

(47) 

(48) 

(49) 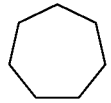

(50) 

Examples of the alicyclic hydrocarbon group represented by $Z_1$ include residues formed by removing one or more hydrogen atoms from, e.g., adamantyl, noradamantyl, decalin residues, tricyclodecanyl, tetracyclododecanyl, norbornyl, cedrol, cyclohexyl, cycloheptyl, cyclooctyl, cyclodecanyl, and cyclododecanyl. The alicyclic hydrocarbon group represented by $Z_1$ preferably is an adamantane residue, tricyclodecane residue, tetracyclododecane residue, or norbornane residue, and more preferably is an adamantane residue.

The alkyl group represented by X may be any of linear, branched, and cyclic groups.

The linear or branched alkyl group preferably is an alkyl group having 1 to 8 carbon atoms. Examples thereof include methyl, ethyl, propyl, n-butyl, sec-butyl, hexyl, 2-ethylhexyl, and octyl. More preferred examples thereof include alkyl groups having 1 to 5 carbon atoms (e.g., methyl, ethyl, propyl, isopropyl, and butyl). Especially preferred examples thereof include alkyl groups having 1 to 3 carbon atoms (e.g., methyl, ethyl, propyl, and isopropyl).

The cyclic alkyl group may be monocyclic or polycyclic. Preferred examples of the monocyclic alkyl group include ones having 3 to 8 carbon atoms, such as, e.g., cyclopropyl, cyclopentyl, cyclohexyl, cycloheptyl, and cyclooctyl. Preferred examples of the polycyclic alkyl group include ones having 6 to 20 carbon atoms, such as, e.g., adamantyl, norbornyl, isobornyl, camphonyl, dicyclopentyl, α-pinel, tricyclodecanyl, tetracyclododecyl, and androstanyl. Such cycloalkyl groups include ones in which the carbon atoms constituting the ring have been partly replaced by one or more heteroatoms selected from, e.g., oxygen, sulfur, and nitrogen atoms.

The alkoxy group represented by X may be any of linear, branched, and cyclic groups. Preferred examples thereof include alkoxy groups having 1 to 8 carbon atoms, such as, e.g., methoxy, ethoxy, n-propoxy, isopropoxy, butoxy, pentoxy, allyloxy, and octoxy. More preferred examples thereof include alkoxy groups having 1 to 4 carbon atoms (e.g., methoxy, ethoxy, propoxy, and butoxy).

The alkyl group and alkoxy group represented by X may further have one or more substituents selected from, e.g., hydroxy, halogen atoms, and alkoxy groups (preferably having 1 to 5 carbon atoms).

From the standpoint of developability and sensitivity, X preferably is hydroxy, an alkoxy group, or cyano. More preferably, X is hydroxy or an alkoxy group. Especially preferably, X is hydroxy.

The alicyclic hydrocarbon group represented by $Z_1$ may have other substituent(s) selected from, e.g., carboxyl and alkoxycarbonyl groups.

X may be bonded to one of the carbon atoms constituting the alicyclic hydrocarbon group $Z_1$, or may be bonded to a carbon atom of a substituent bonded to the alicyclic hydrocarbon group $Z_1$.

Examples of $L_2$ are the same as those of $L_1$ in formula (VI).

Symbol p represents an integer of 1 to 4, preferably 2 or 3.

Resin (A) in the invention preferably contains at least either of repeating units represented by formula (VIII) and repeating units represented by formula (IX), besides repeating units represented by formula (I) and repeating units represented by at least one of formulae (II) to (VI).

Examples of the organic group represented by $Y_2$ in general formula (VIII) include the same organic groups as those enumerated above with regard to general formula (Z).

Examples of the repeating units represented by general formula (VIII) are shown below, but the repeating units in the invention should not be construed as being limited to these examples.

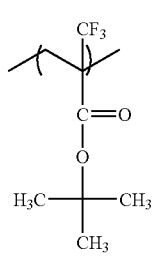
(B-1')

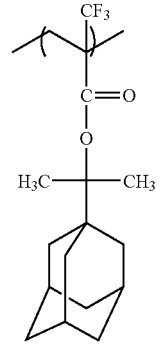
(B-8")

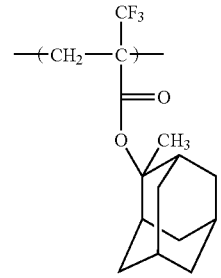
(B-7')

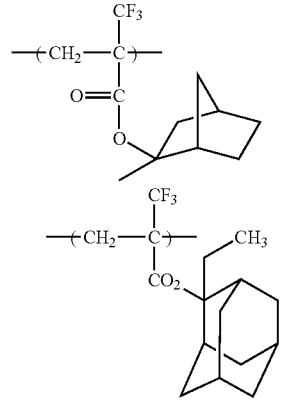
(B-12')

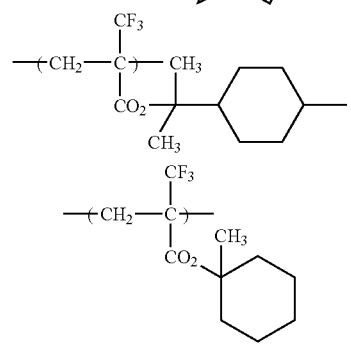

In general formula (IX), $R_5$ represents a hydrogen atom, a halogen atom, a cyano group, or an alkyl group.

$R^{50}$ to $R^{55}$ each independently represent a hydrogen atom, a fluorine atom, or an alkyl group, provided that at least one of $R^{50}$ to $R^{55}$ is a fluorine atom or an alkyl group in which at least one of the hydrogen atoms has been replaced by a fluorine atom.

$Y_4$ represents a hydrogen atom or an organic group.

Examples of the organic group represented by Y₄ in general formula (IX) include the same organic groups as those enumerated above as examples of Y in general formula (Z). Examples of $R_5$ and $R^{50}$ to $R^{55}$ are the same as those of the $R_5$ and $R^{50}$ to $R^{55}$ in general formula (I).

Examples of the repeating units represented by general formula (IX) are shown below, but the repeating units in the invention should not be construed as being limited to these examples.

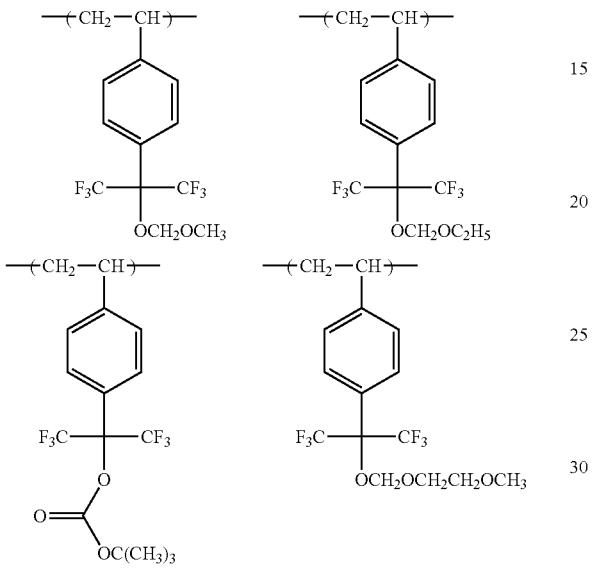

In producing the resin as ingredient (A), other comonomers may be copolymerized.

Examples of usable comonomers include compounds having one addition-polymerizable unsaturated bond, other than those shown above, selected from acrylic esters, acrylamide and derivatives thereof, methacrylic esters, methacrylamide and derivatives thereof, allyl compounds, vinyl ethers, vinyl esters, styrene and derivatives thereof, crotonic esters, and the like.

Preferred examples of resin (A) according to the invention are shown below, but the resin to be used in the invention should not be construed as being limited to these examples.

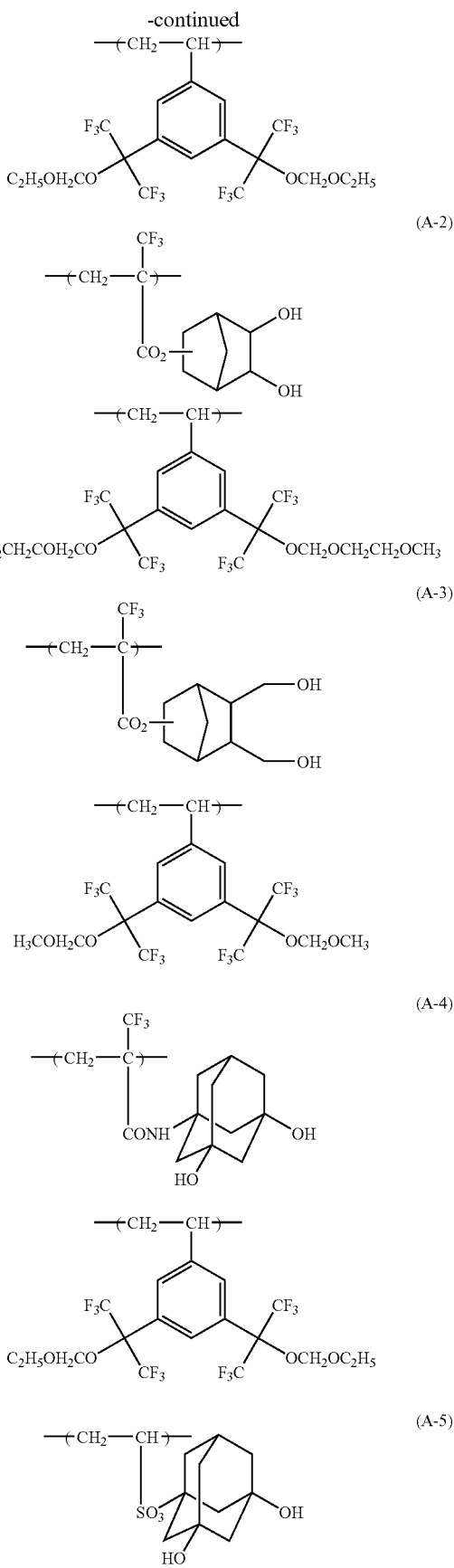

-continued
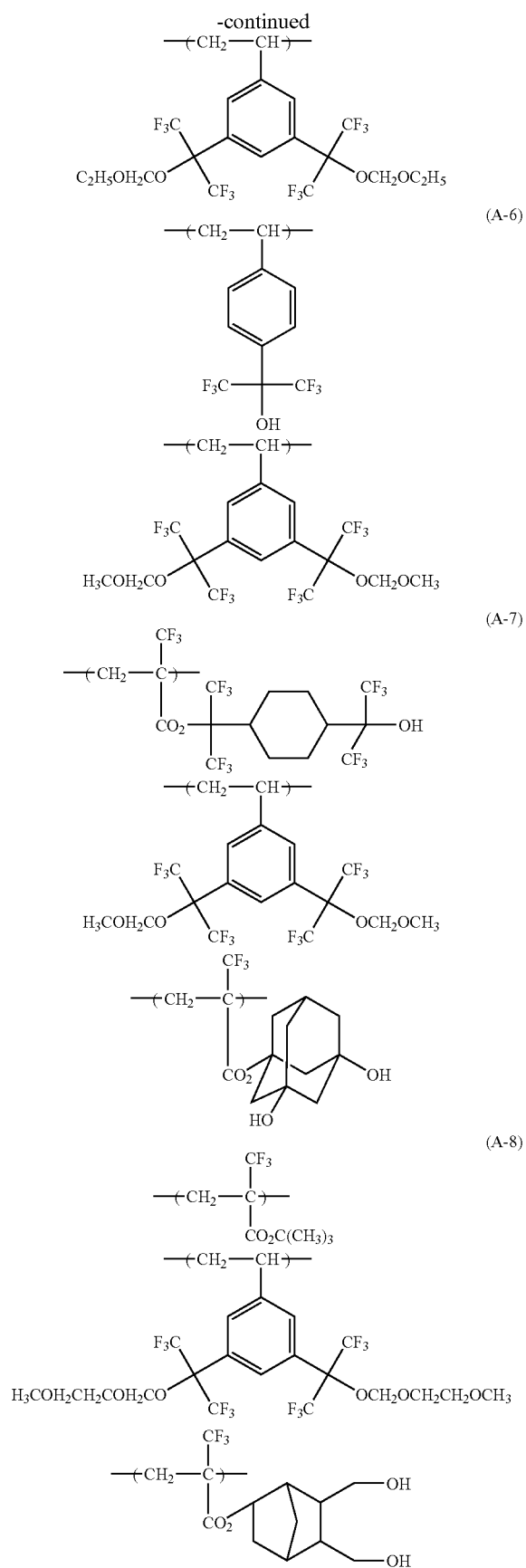
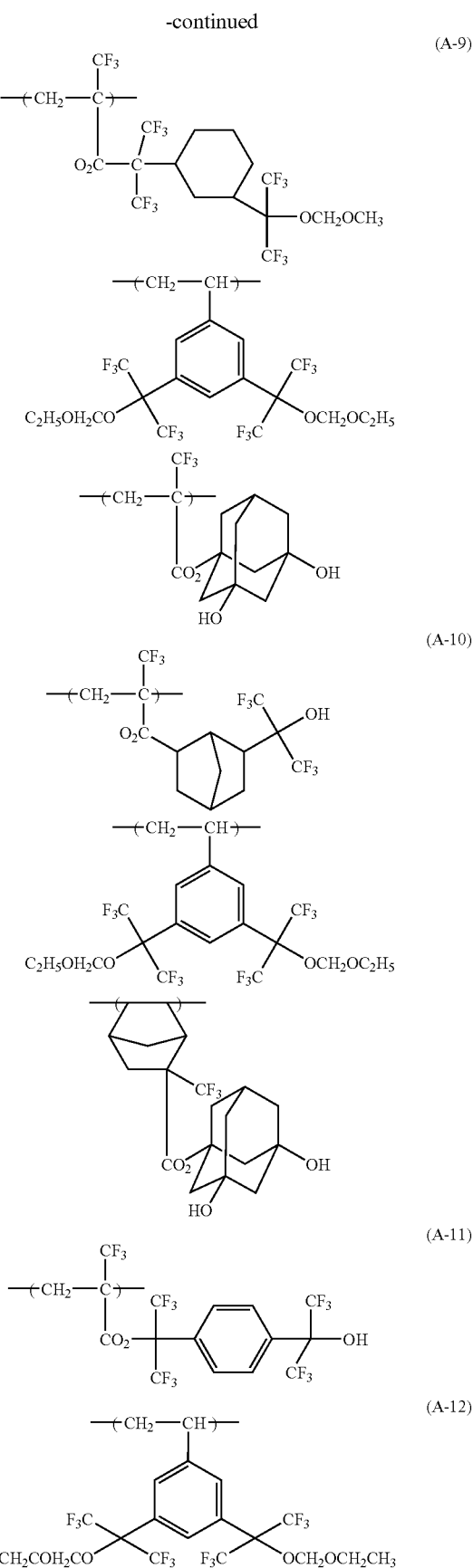

-continued

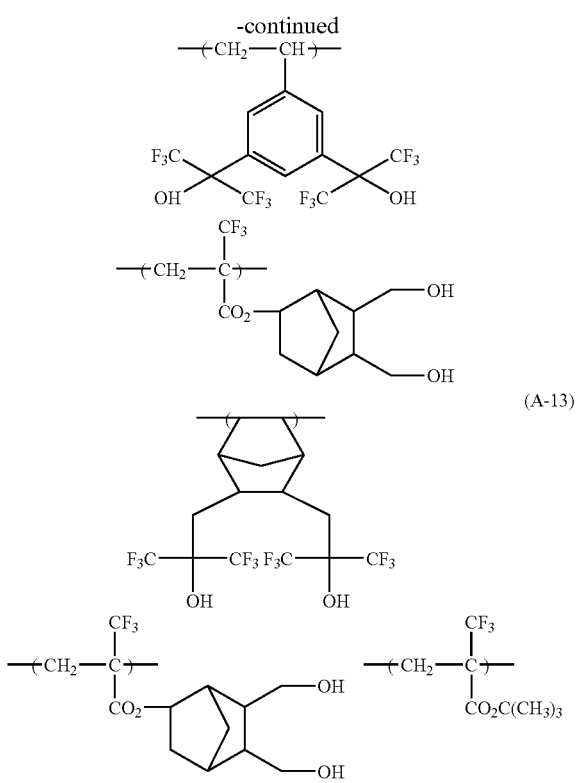

(A-13)

In the resin as ingredient (A), the total content of the repeating units represented by general formula (I) is generally from 3 to 95% by mole, preferably from 5 to 80% by mole, more preferably from 7 to 70% by mole.

The total content of the repeating units represented by general formulae (II) to (VI) in the resin as ingredient (A) is generally from 3 to 90% by mole, preferably from 5 to 80% by mole, more preferably from 7 to 70% by mole.

The total content of the repeating units represented by general formulae (VIII) to (IX) in the resin as ingredient (A) is generally from 1 to 80% by mole, preferably from 3 to 70% by mole, more preferably from 5 to 50% by mole.

The total content of the repeating units having an acid-dissociable group in the resin as ingredient (A) is generally from 3 to 95% by mole, preferably from 5 to 80% by mole, more preferably from 7 to 70% by mole.

The molecular weight of resin (A) is generally in the range of preferably from 1,000 to 200,000, more preferably from 3,000 to 200,000, in terms of weight-average molecular weight. The most preferred range thereof is from 3,000 to 50,000. The molecular-weight distribution (dispersity ratio: $M_w/M_n$) thereof is in the range of generally from 1 to 10, preferably from 1 to 3, more preferably from 1 to 2. The most preferred range thereof is from 1 to 1.7. The narrower the molecular-weight distribution, the better the applicability, sensitivity, and contrast. In the invention, the proportion of resins having a molecular weight of 1,000 or lower is preferably 20% or lower, more preferably 15% or lower, even more preferably 10% or lower. The proportion of residual monomers in resin (A) is preferably 10% or lower, more preferably 7% or lower, even more preferably 5% or lower.

The amount of resin (A) to be added is in the range of generally from 50 to 99.5% by weight, preferably from 60 to 98% by weight, more preferably from 65 to 95% by weight, based on all solid components of the composition.

The acid-decomposable resin to be used in the invention can be synthesized by an ordinary method (e.g., radical polymerization). For example, a general synthesis method is as follows. Monomers are introduced into a reaction vessel either en bloc or during reaction, and dissolved in a reaction solvent according to need. This solvent, for example, is an ether such as tetrahydrofuran, 1,4-dioxane, or diisopropyl ether, a ketone such as methyl ethyl ketone or methyl isobutyl ketone, an ester solvent such as ethyl acetate, or the solvent described later in which various monomers can dissolve, such as propylene glycol monomethyl ether acetate. Thus, a homogeneous solution is obtained. Thereafter, in an inert gas atmosphere, e.g., nitrogen or argon, a commercial free-radical initiator (e.g., an azo initiator or peroxide) is used to initiate polymerization optionally with heating. According to need, the initiator may be introduced additionally or portion-wise. After completion of the reaction, the reaction mixture is poured into a solvent and the target polymer is recovered by a method for powder or solid recovery, etc. The concentration of the reactants is generally 20% by weight or higher, preferably 30% by weight or higher, more preferably 40% by weight or higher. The reaction temperature is generally from 10 to 150° C., preferably from 30 to 120° C., more preferably from 50 to 100° C. In synthesizing the resin, anionic polymerization is more suitable for some monomers. Methods of polymerization are described in *Jikken Kagaku Kôza* 28, *Kôbunshi Gôsei*, edited by The Chemical Society of Japan (Maruzen) and *Shin Jikken Kagaku Kôza* 19, *Kôbunshi Kagaku*, edited by The Chemical Society of Japan (Maruzen).

In the invention, it is preferred that the amount of metallic ingredients such as, e.g., sodium, potassium, calcium, iron, and magnesium contained in the resin as ingredient (A) be small. Specifically, the content of each metal in the resin is preferably 300 ppb or lower, more preferably 200 ppb or lower, even more preferably 100 ppb or lower.

[2] Compound Generating Acid by the Action of Actinic Rays or Radiation (Compounds B1 and B2)

The positive resist composition of the invention preferably contains at least one compound (compound B1) which generates an organic sulfonic acid upon irradiation with actinic rays or a radiation, in particular, $F_2$ excimer laser light. Especially preferably, compound (B1) comprises at least one compound which generates an organic sulfonic acid containing at least one fluorine atom by the action of actinic rays or a radiation and at least one compound which generates an organic sulfonic acid containing no fluorine atom by the action of actinic rays or a radiation.

It is also preferred that the composition should contain a compound (compound B2) which generates a carboxylic acid by the action of actinic rays or a radiation. When compound (B1) is used in combination with compound (B2), applicability and contrast can be enhanced.

The organic sulfonic acid and carboxylic acid to be generated by compounds (B1) and (B2) may be either aliphatic or aromatic.

The sulfonic acid to be generated by compound (B1) has preferably 1 to 20, more preferably 2 to 16, even more preferably 3 to 12 carbon atoms.

The compounds (compounds (B1) and (B2)) which generate an acid upon irradiation with actinic rays or a radiation can be selected from compounds in general use as compounds which decompose upon irradiation with actinic rays or a radiation to generate an acid (photo-acid generators).

Namely, compounds (B1) and (B2) to be used can be suitably selected from photoinitiators for cationic photopolymerization, photoinitiators for radical photopolymerization, photodecolorants or optical color changers for dyes, known compounds used in microresist formation or the like which generate an acid by the action of a light (ultraviolet rays of from 400 to 200 nm or far ultraviolet rays, especially preferably g-line, h-line, i-line, or KrF excimer laser light) or of ArF excimer laser light, $F_2$ excimer laser light, electron beams, X-rays, molecular beams, or ion beams, and mixtures of two or more thereof.

Examples of such compounds include onium salts such as: the diazonium salts described in, e.g., S. I. Schlesinger, Photogr. Sci. Eng., 18, 387 (1974) and T. S. Bal et al., Polymer, 21, 423 (1980); the ammonium salts described in, e.g., U.S. Pat. Nos. 4,069,055 and 4,069,056, U.S. Reissued Patent 27,992, and JP-A-3-140140; the phosphonium salts described in, e.g., D. C. Necker et al., Macromolecules, 17, 2468 (1984), C. S. Wen et al., Teh, Proc. Conf. Rad. Curing ASIA, p. 478 Tokyo, Oct. (1988), and U.S. Pat. Nos. 4,069,055 and 4,069,056; the iodonium salts described in, e.g., J. V. Crivello et al., Macromolecules, 10 (6), 1307 (1977), Chem. & Eng. News, Nov. 28, p. 31 (1988), European Patent 104,143, U.S. Pat. Nos. 339,049 and 410,201, JP-A-2-150848, and JP-A-2-296514; the sulfonium salts described in, e.g., J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14,279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 161,811, 410,201, 339, 049, 233,567, 297,443, and 297,442, U.S. Pat. Nos. 4,933, 377, 3,902,114, 4,760,013, 4,734,444, and 2,833,827, and German Patents 2,904,626, 3,604,580, and 3,604,581; the selenonium salts described in, e.g., J. V. Crivello et al., Macromolecules, 10 (6), 1307 (1977) and J. V. Crivello et al., J. Polymer Sci., Polymer Chem. Ed., 17, 1047 (1979); and the arsonium salts described in, e.g., C. S. Wen et al., Teh, Proc. Conf. Rad. Curing ASIA, p. 478 Tokyo, Oct. (1988). Examples thereof further include the organohalogen compounds described in, e.g., U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), and JP-A-2-161445; the photo-acid generators having an o-nitrobenzyl type protective group described in, e.g., S. Hayase et al., J. Polymer Sci., 25, 753 (1987), E. Reichmanis et al., J. Pholymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0,290, 750, 046, 083, 156, 535, 271, 851, and 0,388,343, U.S. Pat. Nos. 3,901,710 and 4,181,531, JP-A-60-198538, and JP-A-53-133022; compounds which photodecompose to generate a sulfonic acid and are represented by the iminosulfonates and the like described in, e.g., M. Tunooka et al., Polymer Preprints, Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0,199,672, 84,515, 044, 115, 618,564, and 0,101, 122, U.S. Pat. Nos. 4,371,605 and 4,431,774, JP-A-64-18143, JP-A-2-245756, and JP-A-3-140109; and the disulfone compounds described in, e.g., JP-A-61-166544.

Preferred examples of combinations of compound (B1) and compound (B2) include the following.

A combination of:
compound (B1) comprising a compound which, upon irradiation with actinic rays or a radiation, generates an aliphatic or aromatic sulfonic acid substituted with at least one fluorine atom and a compound which, upon the irradiation, generates an aliphatic or aromatic sulfonic acid in which the anion contains no fluorine atom; and compound (B2) comprising an ionic compound having an aliphatic or aromatic carboxylic acid which may have one or more fluorine atoms.

[a]The compound which generates a fluorinated sulfonic acid upon irradiation with actinic rays or a radiation (and an ionic compound having a fluorinated sulfonic acid as an anion) will be explained below.

Examples thereof include iodonium salts represented by the following general formula (PAG3) and sulfonium salts represented by the following general formula (PAG4).

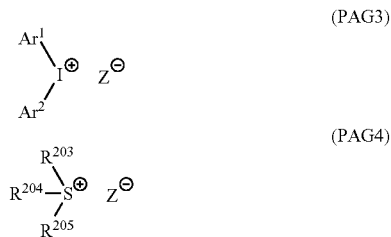

In the formula, $Ar^1$ and $Ar^2$ each independently represent a substituted or unsubstituted aryl group. $R^{203}$, $R^{204}$, and $R^{205}$ each independently represent a substituted or unsubstituted alkyl group or aryl group.

$Z^-$ represents a sulfonic acid anion having at least one fluorine atom.

Two of $R^{203}$, $R^{204}$, and $R^{205}$ may be bonded to each other through a single bond or substituent of each. $Ar^1$ and $Ar^2$ may also be bonded to each other likewise.

The aryl groups represented by $Ar^1$, $Ar^2$, $R^{203}$ $R^{204}$ and $R^{205}$ preferably are aryl groups having 6 to 14 carbon atoms. The alkyl groups preferably are alkyl groups having 1 to 8 carbon atoms.

Preferred examples of substituents for the aryl groups include alkoxy groups having 1 to 8 carbon atoms, alkyl groups having 1 to 8 carbon atoms, alkoxycarbonyl groups having 2 to 9 carbon atoms, alkylcarbonylamino groups having 2 to 9 carbon atoms, nitro, carboxyl, hydroxy, halogen atoms, and phenylthio. Preferred examples of substituents for the alkyl groups include alkoxy groups having 1 to 8 carbon atoms, aryl groups having 5 to 14 carbon atoms, arylcarbonyl groups having 6 to 15 carbon atoms, carboxyl, and halogen atoms.

Preferred examples of the sulfonic acid anion represented by Z⁻ include aliphatic hydrocarbons having 1 to 20 carbon atoms and at least one fluorine atom and aromatic hydrocarbons having 5 to 20 carbon atoms and at least one fluorine atom. These hydrocarbons may have one or more substituents. Examples of the substituents include optionally fluorinated alkoxy groups having 1 to 10 carbon atoms, optionally fluorinated alkoxycarbonyl groups having 2 to 11 carbon atoms, phenylamino, phenylcarbonyl, halogen atoms, and hydroxy. Examples of the substituents for the aromatic hydrocarbons further include alkyl groups having 1 to 15 carbon atoms.

Specific examples of the compounds are shown below, but these acid generators should not be construed as being limited to the following examples.

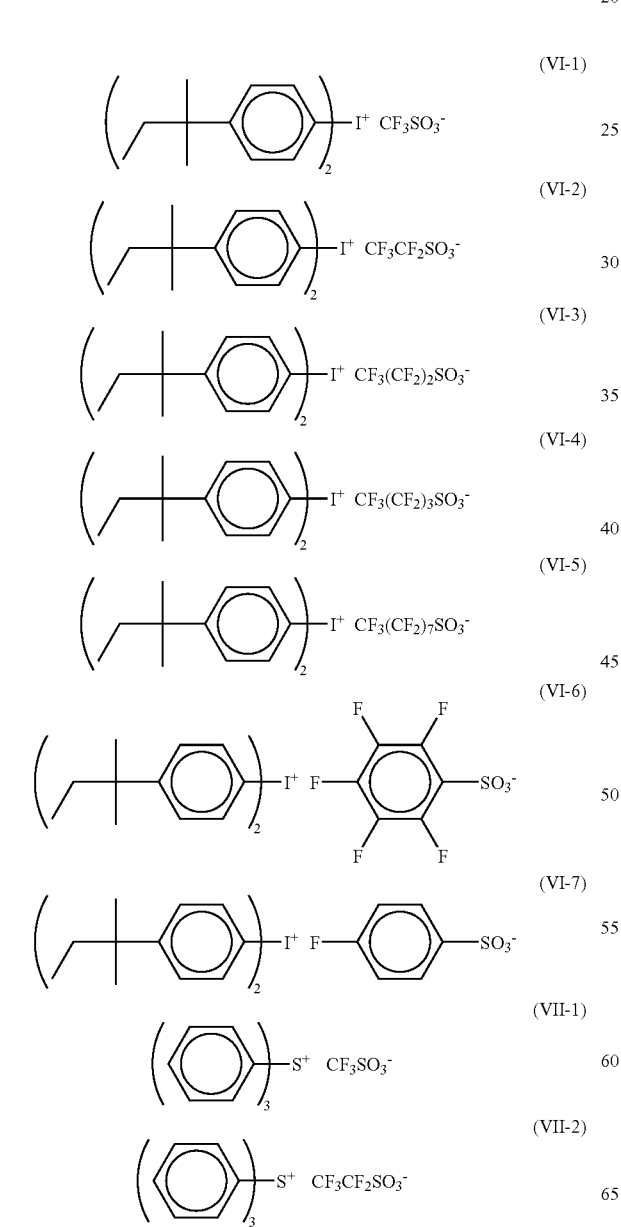

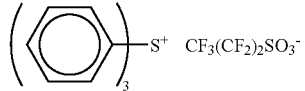

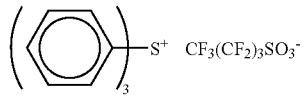

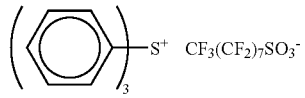

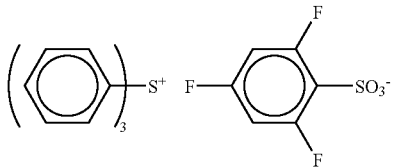

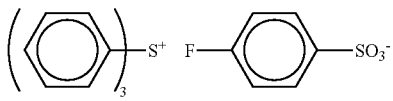

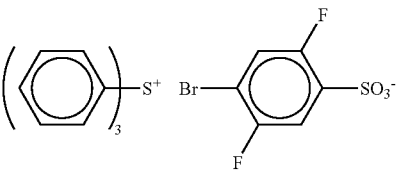

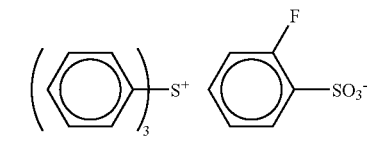

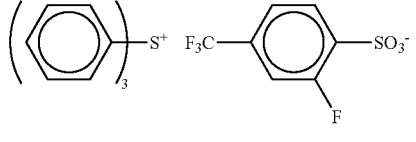

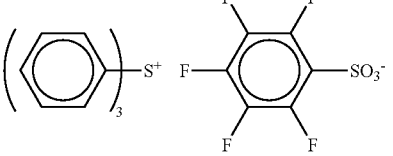

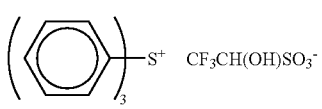

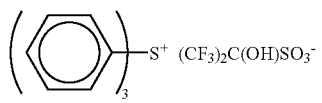

-continued
(VII-14) 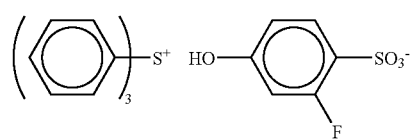
(VII-15) 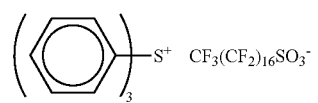
(VII-16) 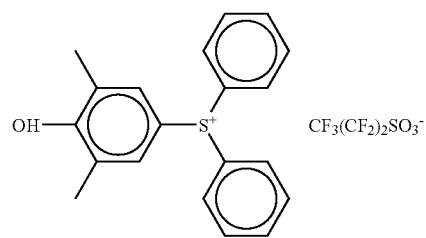
(VII-17) 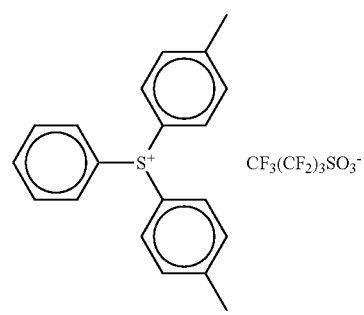
(VII-18) 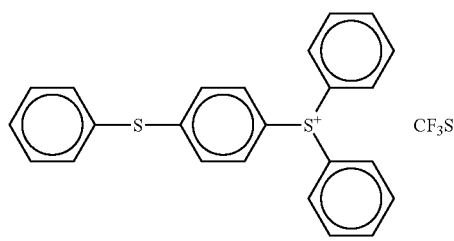
(VII-19) 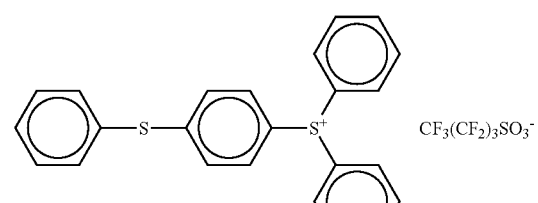
(VII-20) 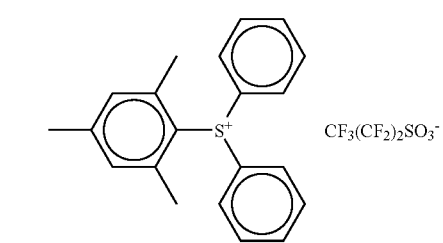
(VII-21) 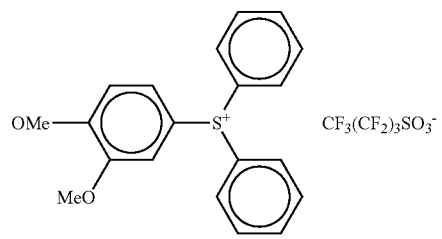
(VII-22) 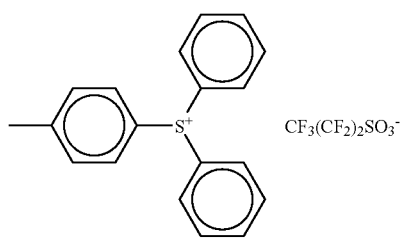
(VII-23) 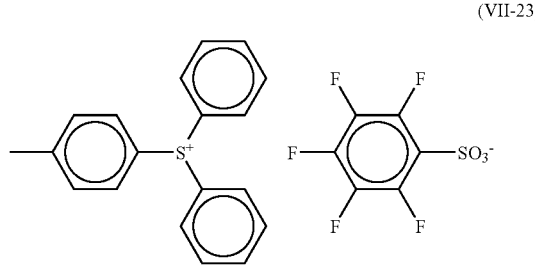
(VII-24) 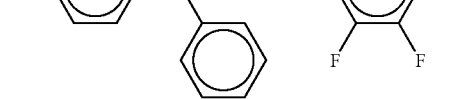
(VII-25) 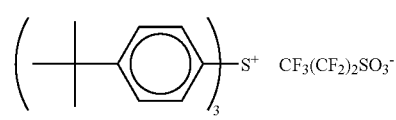
(VII-26) 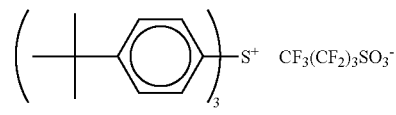
(VII-27) 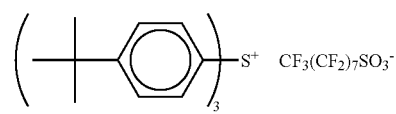
(VII-28) 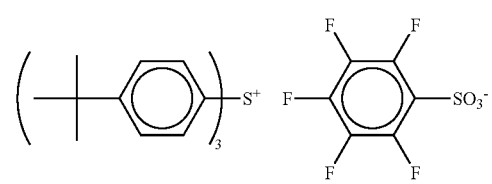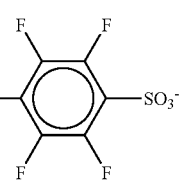

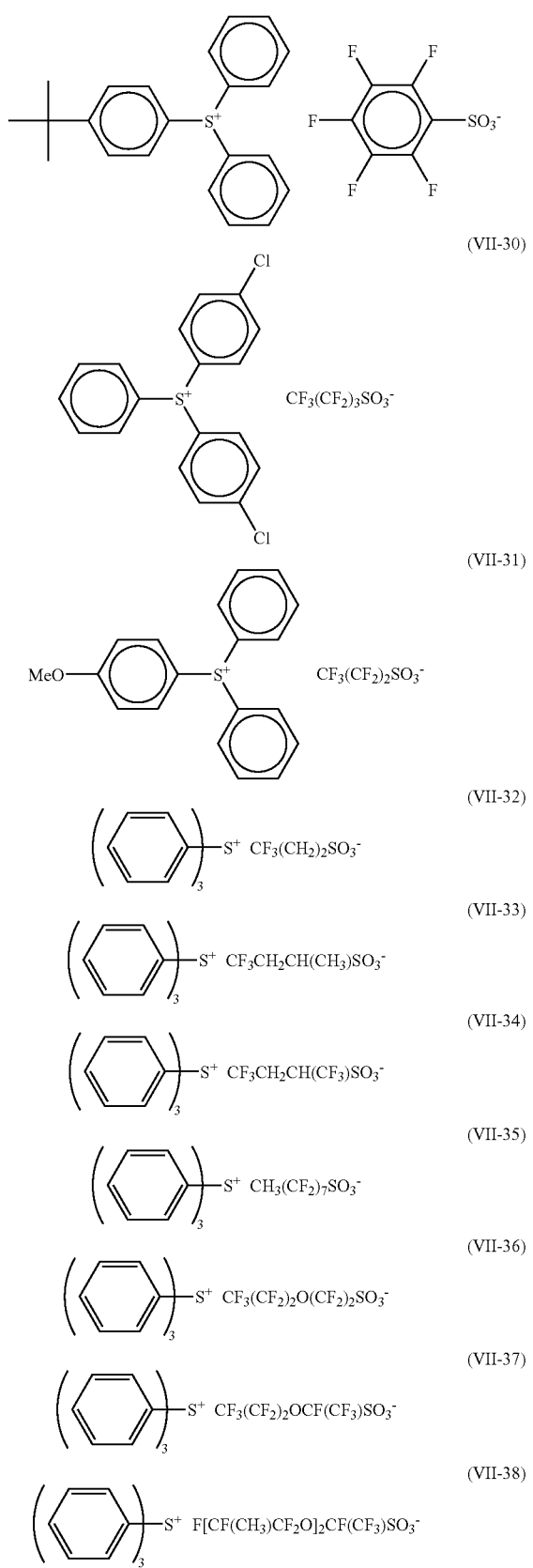

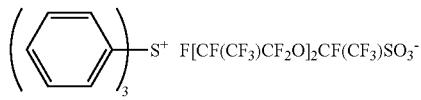

[b] Examples of the compound which generates a nonfluorinated sulfonic acid upon irradiation with actinic rays or a radiation and the ionic compound having a nonfluorinated sulfonic acid as an anion include iodonium salts and sulfonium salts represented by general formulae (PAG3) and (PAG4) wherein Z⁻ is sulfonic acid anion having no fluorine atom.

Specific examples thereof are shown below, but those acid generators should not be construed as being limited to the following examples.

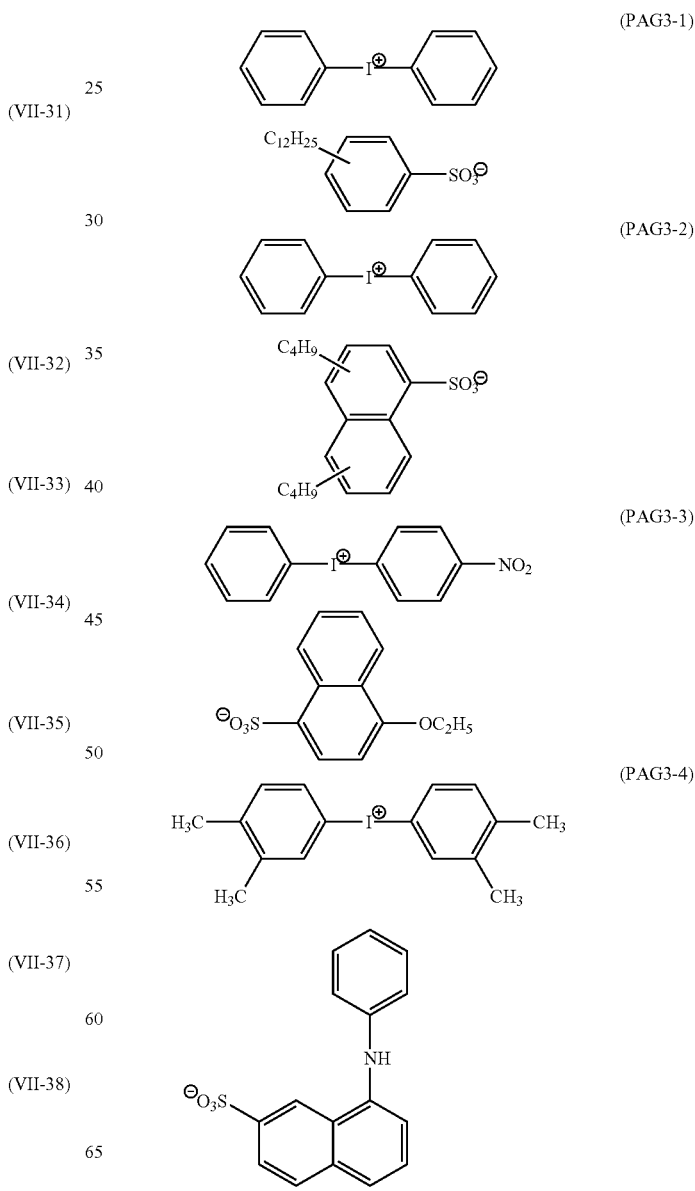

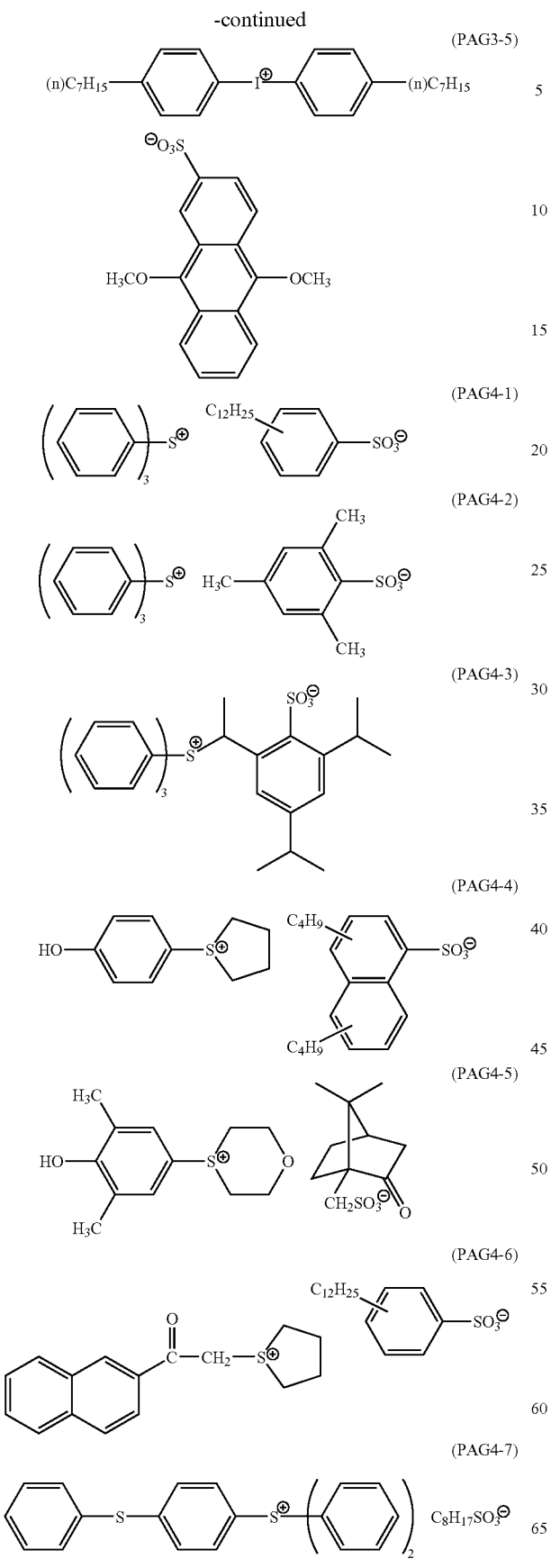

Examples thereof further include disulfone derivatives represented by the following general formula (PAG5) and iminosulfonate derivatives represented by the following general formula (PAG6).

$$Ar^3-SO_2-SO_2-Ar^4 \quad \text{(PAG5)}$$

(PAG6)

In the formulae, $Ar^3$ and $Ar^4$ each independently represent a substituted or unsubstituted aryl group. $R^{206}$ represents a substituted or unsubstituted alkyl group or aryl groups, and A represents a substituted or unsubstituted alkylene group, alkenylene group, or arylene group.

Specific examples thereof are shown below, but those acid generators should not be construed as being limited to the following examples.

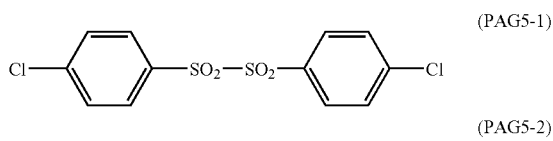
(PAG5-1)

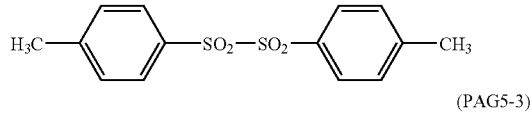
(PAG5-2)

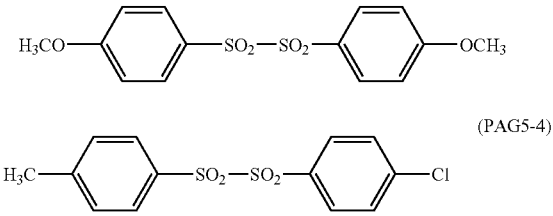
(PAG5-3)

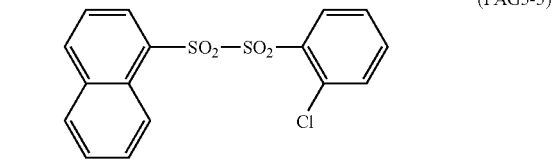
(PAG5-4)

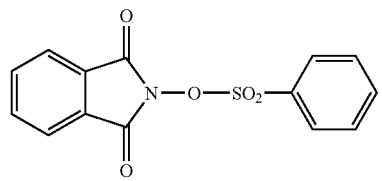
(PAG5-5)

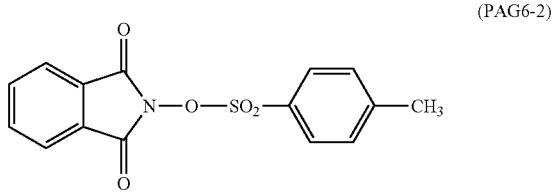
(PAG6-1)

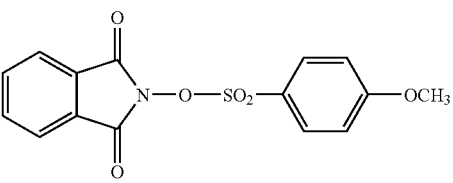
(PAG6-2)

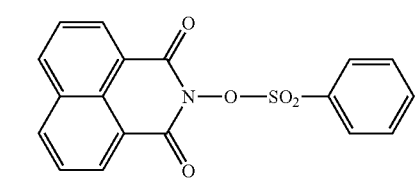
(PAG6-3)

(PAG6-4)

Examples of the compounds which generate a nonfluorinated sulfonic acid furthermore include diazo disulfone derivatives represented by the following general formula (PAG7).

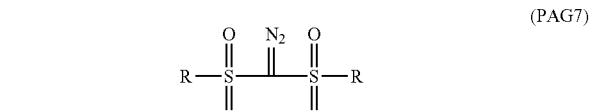
(PAG7)

In the formula, R represents a linear, branched, or cyclic alkyl group or an optionally substituted aryl group.

Specific examples thereof are shown below, but those acid generators should not be construed as being limited to the following examples.

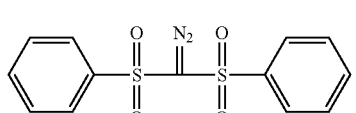
(PAG7-1)

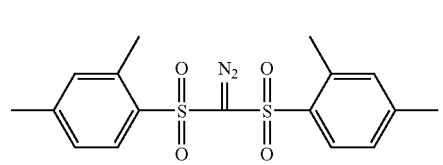
(PAG7-2)

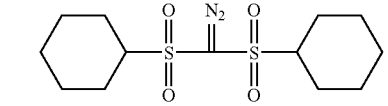
(PAG7-3)

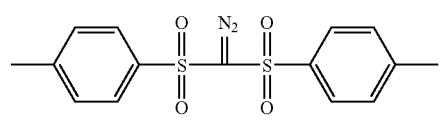
(PAG7-4)

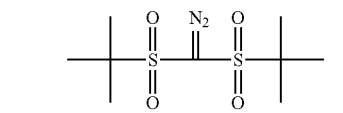
(PAG7-5)

The compounds described above under [a] and [b] can be synthesized by reacting an aromatic compound with a periodic acid salt and subjecting the resultant iodonium salt to salt interchange with the corresponding sulfonic acid.

Alternatively, the target compounds can be synthesized by reacting an aryl Grignard reagent such as an arylmagnesium bromide with a substituted or unsubstituted phenyl sulfoxide and subjecting the resultant triarylsulfonium halide to salt interchange with the corresponding sulfonic acid. Furthermore, the target compounds can be synthesized also by other methods, such as: a method in which a substituted or unsubstituted phenyl sulfoxide and the corresponding aromatic compound are subjected to condensation and salt interchange using an acid catalyst such as methanesulfonic acid/diphosphorus pentoxide or aluminum chloride; and a method in which a diaryliodonium salt and a diaryl sulfide are subjected to condensation and salt interchange using a catalyst such as copper acetate.

The salt interchange can be conducted by a method in which a halide salt is synthesized first and this salt is converted to a sulfonic acid salt using a silver reagent, e.g., silver oxide. The salt interchange may be accomplished also with an ion-exchange resin. The sulfonic acid or sulfonic acid salt to be used in the salt interchange may be a commercial one, or can be obtained, for example, by hydrolyzing a commercial sulfonic acid halide.

[c] The compound which generates a fluorinated carboxylic acid upon irradiation with actinic rays or a radiation and the ionic compound having a fluorinated carboxylic acid as an anion will be explained below.

Examples of fluorinated aliphatic carboxylic acids include products of the fluorination of aliphatic carboxylic acids such as acetic acid, propionic acid, n-butyric acid, isobutyric acid, valerianic acid, trimethylacetic acid, caproic acid, heptanoic acid, caprylic acid, pelargonic acid, capric acid, lauric acid, myristic acid, palmitic acid, stearic acid, undecanoic acid, dodecanoic acid, and tridecanoic acid. These carboxylic acids may have one or more substituents selected from hydroxy, alkoxy groups, and halogen atoms. Preferred aliphatic carboxylic acids are ones in which the aliphatic chain contains therein a connecting group such as, e.g., an oxygen atom, sulfur atom, carbonyl, carboxyl, or sulfonyl.

Preferred examples of the fluorinated aliphatic carboxylic acids include ones represented by the following general formula.

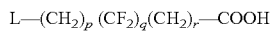

L—(CH$_2$)$_p$ (CF$_2$)$_q$(CH$_2$)$_r$—COOH

In the general formula, L represents a hydrogen atom or a fluorine atom. Symbols p and r each independently represent an integer of 0 to 15, and q represents an integer of 1 to 15. One or more of the hydrogen atoms or fluorine atoms of the alkyl chain in this general formula may have been replaced by an optionally fluorinated alkyl group (preferably having 1 to 5 carbon atoms), an optionally fluorinated alkoxy group (preferably having 1 to 5 carbon atoms), or hydroxy.

The fluorinated aliphatic carboxylic acids preferably are products of the fluorination of saturated aliphatic carboxylic acids having preferably 2 to 20, more preferably 4 to 20 carbon atoms. When the carboxylic acid to be generated through decomposition is such a carboxylic acid having 4 or more carbon atoms, this acid shows reduced diffusibility and, hence, the line width change with time which may occur in the period of from exposure to post-heating can be further diminished. Especially preferred of those are products of the fluorination of linear or branched, saturated, aliphatic carboxylic acids having 4 to 18 carbon atoms.

Preferred fluorinated aromatic carboxylic acids are products of the fluorination of aromatic carboxylic acids having 7 to 20, preferably 7 to 15, more preferably 7 to 11 carbon atoms. Examples thereof include products of the fluorination of aromatic carboxylic acids such as benzoic acid, substituted benzoic acids, naphthoic acid, substituted naphthoic acids, anthracenecarboxylic acid, and substituted anthracenecarboxylic acids (examples of the substituents include alkyl groups, alkoxy groups, hydroxy, halogen atoms, aryl groups, acyl groups, acyloxy groups, nitro, alkylthio groups, and arylthio groups). Preferred of these are products of the fluorination of benzoic acid and substituted benzoic acids.

Those fluorinated, aliphatic or aromatic carboxylic acids are ones in which one or more of the hydrogen atoms present on the backbone excluding the carboxyl group each have been replaced by a fluorine atom. Especially preferably, the fluorinated acids are aliphatic or aromatic carboxylic acids in which all the hydrogen atoms present on the backbone excluding the carboxyl group have been replaced by fluorine atoms (perfluorinated saturated aliphatic carboxylic acids or perfluoroaromatic carboxylic acids). Such fluorinated carboxylic acids bring about higher sensitivity.

Preferred examples of the compounds which generate a fluorinated carboxylic acid include onium salt compounds (e.g., sulfonium salts and iodonium salts) having as a counter anion the anion of a fluorinated, aliphatic or aromatic carboxylic acid such as those shown above. Examples thereof further include imidecarboxylate compounds and nitrobenzyl ester compounds each having a carboxylic ester group.

More preferred examples thereof include compounds represented by the following general formulae (I') to (III'). Use of such acid generators further improves sensitivity, resolution, and exposure margin. When irradiated with actinic rays or a radiation, these compounds generate a saturated aliphatic or aromatic carboxylic acid substituted with at least one fluorine atom and corresponding to X$^-$ in general formula (I'), (II'), or (III'). The compounds thus function as photo-acid generators.

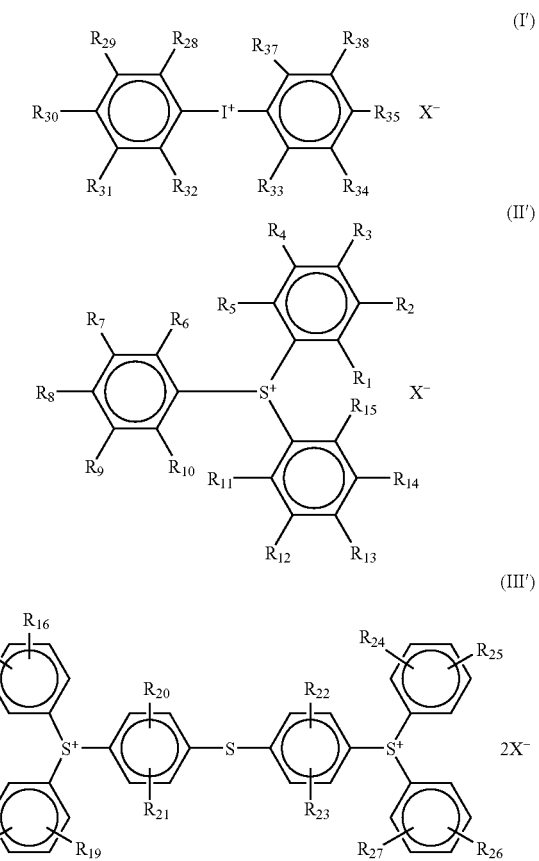

(In the formulae, R$_1$ to R$_{37}$ each independently represent a hydrogen atom, a linear, branched, or cyclic alkyl group, a linear, branched, or cyclic alkoxy group, hydroxy, a halogen atom, or an —S—R$_{38}$ group, wherein R$_{38}$ represents a linear, branched, or cyclic alkyl group or an aryl group. X$^-$ is the anion of an aliphatic or aromatic carboxylic acid substituted with at least one fluorine atom.)

X$^-$ preferably is the anion of a perfluoroaliphatic carboxylic acid or perfluoroaromatic carboxylic acid, and especially preferably is the anion of a perfluoroalkanecarboxylic acid having 4 or more carbon atoms.

Examples of the linear or branched alkyl groups represented by R$_1$ to R$_{38}$ in general formulae (I') to (III') include optionally substituted, linear or branched alkyl groups having 1 to 4 carbon atoms, such as methyl, ethyl, propyl, n-butyl, sec-butyl, and t-butyl. Examples of the cyclic alkyl groups include optionally substituted cycloalkyl groups having 3 to 8 carbon atoms, such as cyclopropyl, cyclopentyl, and cyclohexyl.

Examples of the alkoxy groups represented by $R_1$ to $R_{37}$ include ones having 1 to 4 carbon atoms, such as methoxy, ethoxy, hydroxyethoxy, propoxy, n-butoxy, isobutoxy, sec-butoxy, and t-butoxy.

Examples of the halogen atoms represented by $R_1$ to $R_{37}$ include fluorine, chlorine, bromine, and iodine atoms.

Examples of the aryl group represented by $R_{38}$ include ones having 6 to 14 carbon atoms, such as phenyl, tolyl, methoxyphenyl, and naphthyl. The aryl group may have one or more substituents.

Preferred examples of these substituents include alkoxy groups having 1 to 4 carbon atoms, halogen atoms (fluorine, chlorine, and iodine atoms), aryl groups having 6 to 10 carbon atoms, alkenyl groups having 2 to 6 carbon atoms, cyano, hydroxy, carboxy, alkoxycarbonyl groups, and nitro.

The iodonium compounds or sulfonium compounds represented by general formulae (I') to (III') to be used in the invention each have as the counter anion $X^-$ the anion of a saturated aliphatic or aromatic carboxylic acid substituted with at least one fluorine atom. These anions each are the anion (—COO$^-$) formed by the elimination of the hydrogen atom from the carboxylic acid (—COOH).

Specific examples thereof are show below, but those acid generators should not be construed as being limited to the following examples.

Examples of Photo-Acid Generators (I-1f) to (I-6f) Represented by General Formula (I'):

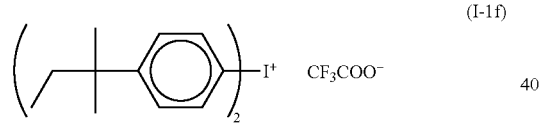
(I-1f)

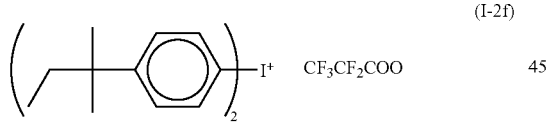
(I-2f)

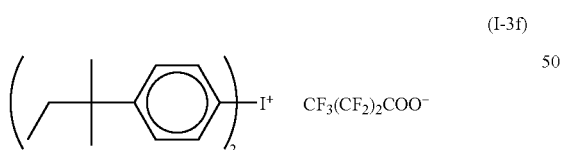
(I-3f)

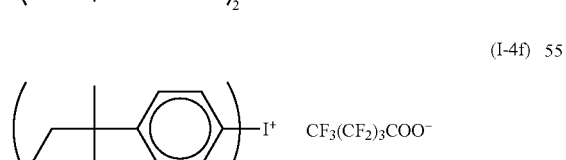
(I-4f)

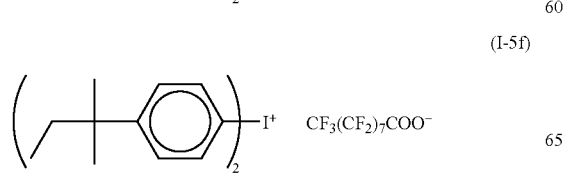
(I-5f)

-continued

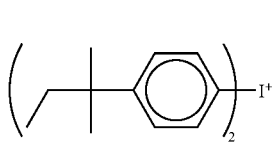 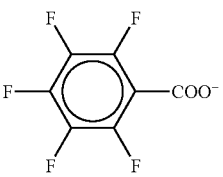
(I-6f)

Examples of Photo-Acid Generators (II-1f) to (II-13f) Represented by General Formula (II'):

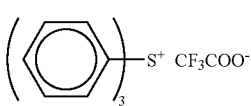
(II-1f)

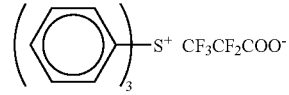
(II-2f)

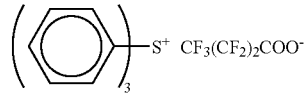
(II-3f)

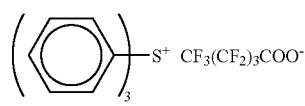
(II-4f)

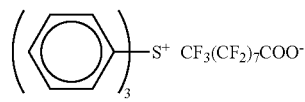
(II-5f)

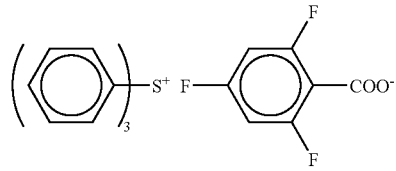
(II-6f)

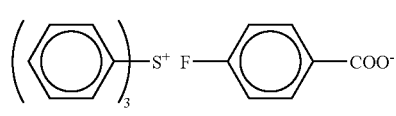
(II-7f)

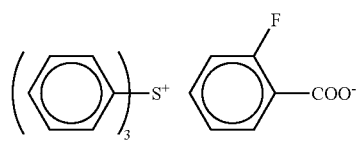
(II-8f)

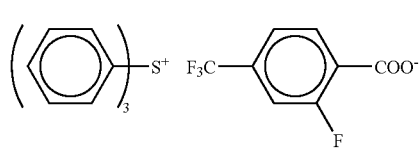
(II-9f)

(II-10f)
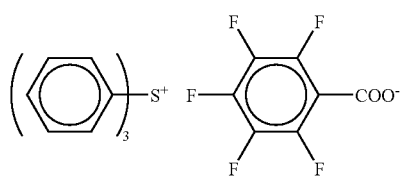

(II-11f)
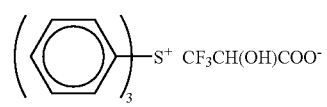

(II-12f)
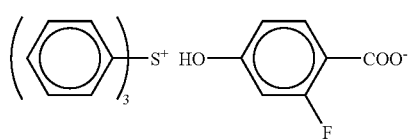

(II-13f)
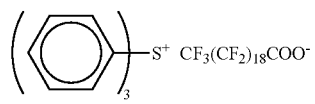

Examples of Photo-Acid Generators (III-1f) to (III-3f) Represented by General Formula (III'):

(III-1f)
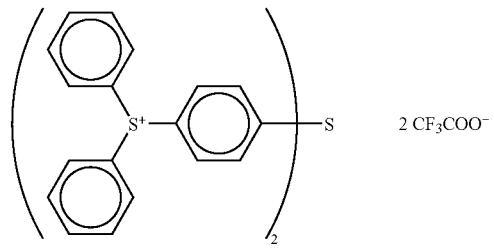

(III-2f)
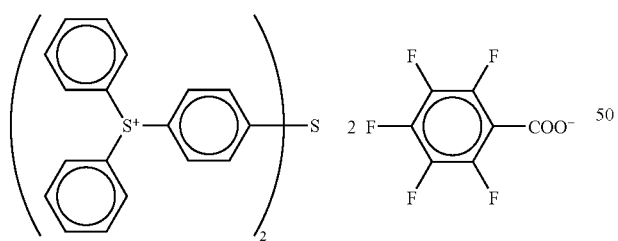

(III-3f)
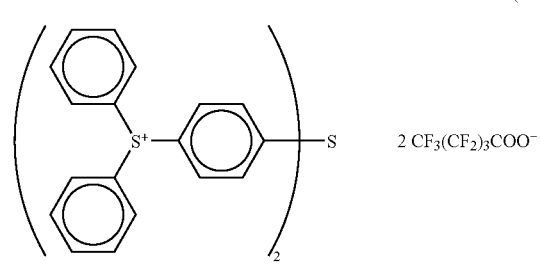

Examples of Other Photo-Acid Generators (IV-1f) to (V-4f):

(IV-1F)
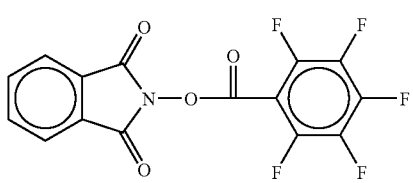

(IV-2f)
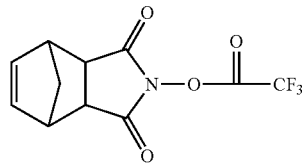

(IV-3f)
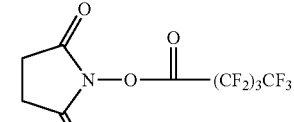

(V-1f)
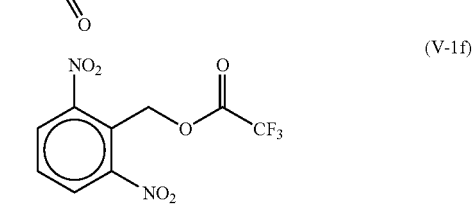

(V-2f)
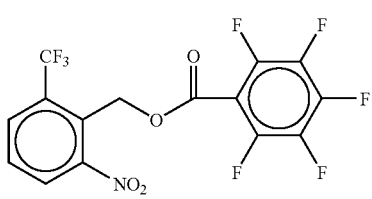

(V-3f)
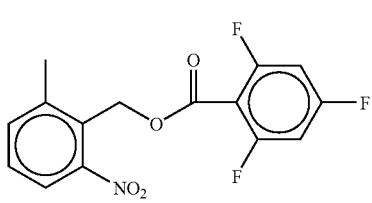

(V-4f)
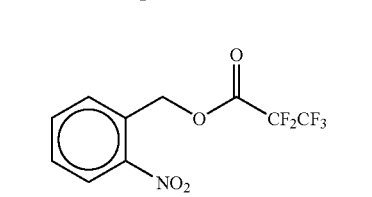

The compounds represented by general formula (I') can be synthesized by reacting an aromatic compound with a periodic acid salt and subjecting the resultant iodonium salt to salt interchange with the corresponding carboxylic acid.

The compounds represented by general formulae (II') and (III') can be synthesized, for example, by reacting an aryl Grignard reagent such as an arylmagnesium bromide with a substituted or unsubstituted phenyl sulfoxide and subjecting the resultant triarylsulfonium halide to salt interchange with the corresponding carboxylic acid. Furthermore, the target compounds can be synthesized also by other methods, such as: a method in which a substituted or unsubstituted phenyl sulfoxide and the corresponding aromatic compound are subjected to condensation and salt interchange using an acid catalyst such as methanesulfonic acid/diphosphorus pentoxide or aluminum chloride; and a method in which a diaryliodonium salt and a diaryl sulfide are subjected to condensation and salt interchange using a catalyst such as copper acetate.

The salt interchange can be conducted by a method in which a halide salt is synthesized first and this salt is converted to a carboxylic acid salt using a silver reagent, e.g., silver oxide. The salt interchange may be accomplished also with an ion-exchange resin. The carboxylic acid or carboxylic acid salt to be used in the salt interchange may be a commercial one, or can be obtained, for example, by hydrolyzing a commercial carboxylic acid halide.

It is also preferred that the fluorinated carboxylic acid to be used for constituting an anion part be one derived from a fluoroaliphatic compound produced by the telomerization method (also called the telomer method) or by the oligomerization method (also called the oligomer method). These processes for producing a fluoroaliphatic compound are described, for example, in *Fusso Kagôbutsu No Gôsei To Kinô* (supervised by Nobuo Ishikawa, published by CMC Publishing Co., Ltd., 1987) pp. 117–118 and *Chemistry of Organic Fluorine Compounds II* (Monograph 187, ed. by Milos Hudlicky and Attila E. Pavlath, American Chemical Society, 1995) pp. 747–752. The telomerization method is a process in which an alkyl halide having a large chain transfer constant, e.g., an iodide, is used as a telogen to conduct radical polymerization of a fluorine-containing vinyl compound, e.g., tetrafluoroethylene, to synthesize a telomer. Synthesis by the telomer method gives a mixture of compounds differing in carbon chain length. This mixture may be used as it is, or the compounds may be used after being purified.

[d] Examples of the compound which generates a nonfluorinated carboxylic acid upon irradiation with actinic rays or a radiation and the ionic compound having a nonfluorinated carboxylic acid as an anion are shown below. However, these acid generators should not be construed as being limited to the following examples.

The examples include compounds represented by the following general formulae (AI) to (AV).

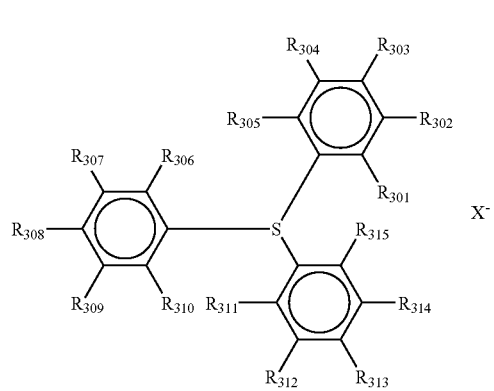

(AI)

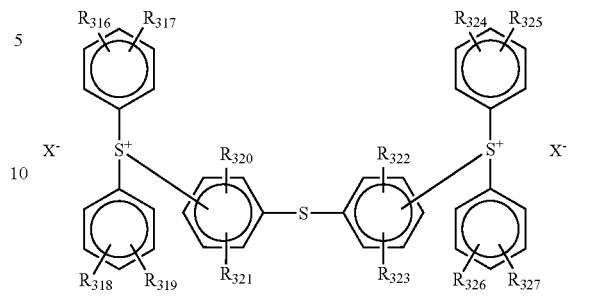

(AII)

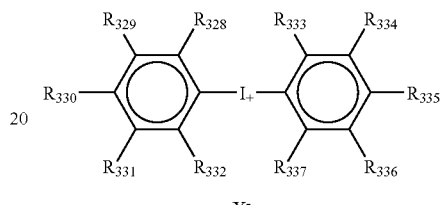

(AIII)

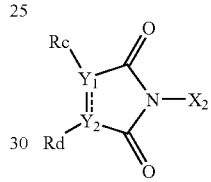

(AIV)

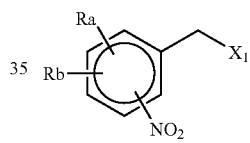

(AV)

In the formulae, $R_{301}$ to $R_{337}$ each independently represent a hydrogen atom, a linear, branched, or cyclic alkyl group, a linear, branched, or cyclic alkoxy group, hydroxy, a halogen atom, or an —S+$R_0$ group, wherein $R_0$ represents a linear, branched, or cyclic alkyl group or an aryl group.

Ra and Rb in formula (AV) each independently represent a hydrogen atom, nitro, a halogen atom, or an alkyl or alkoxy group which may have one or more substituents. Rc and Rd in formula (AIV) each independently represent a halogen atom or an alkyl or aryl group which may have one or more substituents, provided that Rc and Rd may be bonded to each other to form an aromatic ring or a monocyclic or polycyclic hydrocarbon (these rings may contain one or more oxygen and/or nitrogen atoms). $Y_1$ and $Y_2$ each represent a carbon atom, and the bond $Y_1$–$Y_2$ maybe either a single bond or a double bond. X$^-$ represents the anion of a carboxylic acid compound represented by any of the following formulae. $X_1$ and $X_2$ each independently represent a carboxylic acid compound represented by any of the following formulae in which the carboxyl group has been converted to an ester group.

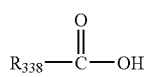

(C1)

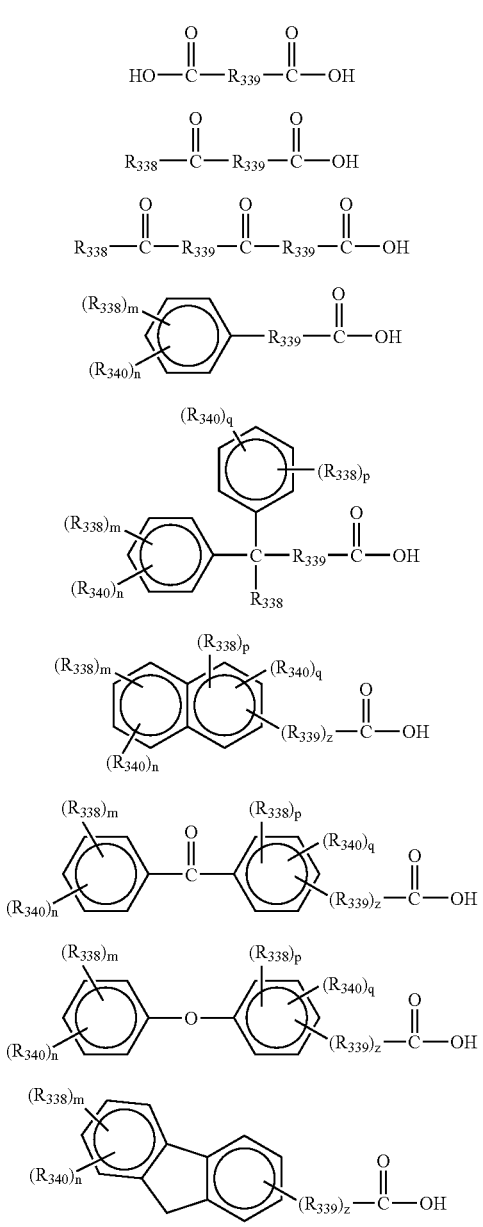

In the formulae, R₃₃₈ represents a linear, branched, or cyclic alkyl group having 1 to 30 carbon atoms (the alkyl chain may contain one or more oxygen and/or nitrogen atoms), a linear, branched, or cyclic alkenyl group having 1 to 20 carbon atoms, a linear, branched, or cyclic alkynyl group having 1 to 20 carbon atoms, a linear, branched, or cyclic alkoxy group having 1 to 20 carbon atoms, a group formed by replacing at least part of the hydrogen atoms of the alkyl group by a halogen atom and/or hydroxy, a group formed by replacing at least part of the hydrogen atoms of the alkenyl group by a halogen atom and/or hydroxy, or a substituted or unsubstituted aryl group having 6 to 20 carbon atoms. Examples of substituents for the aryl group include alkyl groups, nitro, hydroxy, alkoxy groups, acyl groups, alkoxycarbonyl groups, and halogen atoms.

R₃₃₉ represents a single bond, a linear, branched, or cyclic alkylene group having 1 to 20 carbon atoms (the alkylene chain may contain one or more oxygen and/or nitrogen atoms), a linear, branched, or cyclic alkenylene group having 1 to 20 carbon atoms, a group formed by replacing part of the hydrogen atoms of the alkylene group by a halogen atom and/or hydroxy, a group formed by replacing part of the hydrogen atoms of the alkenylene group by a halogen atom, or an alkoxyalkylene group having 2 to 20 carbon atoms. When two or more R₃₃₈'s or R₃₃₉'s are present in each formula, they may be the same or different.

R₃₄₀ represents hydroxy or a halogen atom. When two or more R₃₄₀'s are present in each formula, they may be the same or different. Symbols m, n, p, and q each independently are an integer of 0 to 3, provided that m+n≦5 and p+q≦5. Symbol z is 0 or 1.

Examples of the linear or branched alkyl groups represented by R₃₀₁ to R₃₃₇, Ra, Rb, Rc, Rd, and R₀ in general formulae (AI) to (AV) include optionally substituted, linear or branched alkyl groups having 1 to 4 carbon atoms, such as methyl, ethyl, propyl, n-butyl, sec-butyl, and t-butyl. Examples of the cyclic alkyl groups include optionally substituted cycloalkyl groups having 3 to 8 carbon atoms, such as cyclopropyl, cyclopentyl, and cyclohexyl.

Examples of the alkoxy groups represented by R₃₀₁ to R₃₃₇, Ra, and Rb include ones having 1 to 4 carbon atoms, such as methoxy, ethoxy, hydroxyethoxy, propoxy, n-butoxy, isobutoxy, sec-butoxy, and t-butoxy.

Examples of the halogen atoms represented by R₃₀₁ to R₃₃₇, Ra, Rb, Rc, and Rd include fluorine, chlorine, bromine, and iodine atoms.

Examples of the aryl groups represented by R₀, Rc, and Rd include optionally substituted aryl groups having 6 to 14 carbon atoms, such as phenyl, tolyl, methoxyphenyl, and naphthyl.

Preferred examples of these substituents include alkoxy groups having 1 to 4 carbon atoms, halogen atoms (fluorine, chlorine, and iodine atoms), aryl groups having 6 to 10 carbon atoms, alkenyl groups having 2 to 6 carbon atoms, cyano, hydroxy, carboxy, alkoxycarbonyl groups, and nitro.

Examples of the aromatic ring or monocyclic or polycyclic hydrocarbon (these rings may contain one or more oxygen and/or nitrogen atoms) formed by Rc and Rd bonded to each other include a benzene structure, naphthalene structure, cyclohexane structure, norbornene structure, and oxabicyclo structure.

The sulfonium and iodonium compounds represented by general formulae (AI) to (AIII) which can be used in the invention include ones in which the counter anion X⁻ is at least one of the carboxylic acid compounds represented by formulae (C1) to (C10) in which the carboxyl group (—COOH) has been converted to an anion (—COO⁻).

The compounds represented by general formulae (AIV) and (AV) which can be used in the invention include ones in which the substituents $X_1$ and $X_2$ are at least one of the carboxylic acid compounds represented by general formulae (C1) to (C10) in which the carboxyl group (—COOH) has been converted to an ester group (—COO—).

Examples of the linear, branched, or cyclic alkyl group having 1 to 30 carbon atoms represented by R₃₃₈ (the alkyl chain may contain one or more oxygen and/or nitrogen atoms) include methyl, ethyl, propyl, butyl, pentyl, hexyl, cyclohexyl, dodecyl, 1-ethoxyethyl, and adamantyl.

Examples of the linear, branched, or cyclic alkenyl group having 1 to 20 carbon atoms include ethenyl, propenyl, isopropenyl, and cyclohexenyl.

Examples of the linear, branched, or cyclic alkynyl group having 1 to 20 carbon atoms include acetylene and propenylene.

Examples of the linear, branched, or cyclic alkoxy group having 1 to 20 carbon atoms include methoxy, ethoxy, propyloxy, butoxy, cyclohexyloxy, isobutoxy, and dodecyloxy.

Examples of the substituted or unsubstituted aryl group having 6 to 20 carbon atoms include phenyl, naphthyl, and anthranyl.

Examples of substituents for the aryl group include alkyl groups, nitro, hydroxy, alkoxy groups, acyl groups, alkoxycarbonyl groups, and halogen atoms.

Examples of the linear, branched, or cyclic alkylene group having 1 to 20 carbon atoms represented by $R_{339}$ (the alkylene chain may contain one or more oxygen and/or nitrogen atoms) include methylene, ethylene, propylene, butylene, isobutylene, ethoxyethylene, and cyclohexylene.

Examples of the linear, branched, or cyclic alkenylene group having 1 to 20 carbon atoms include vinylene and allylene.

Specific examples thereof are shown below, but those acid generators should not be construed as being limited to the following examples.

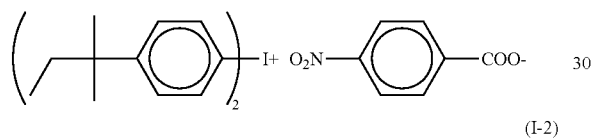
(I-1)

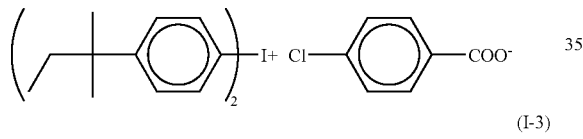
(I-2)

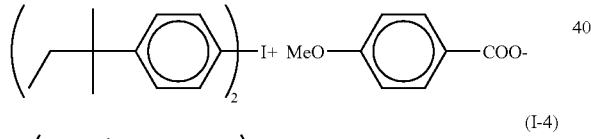
(I-3)

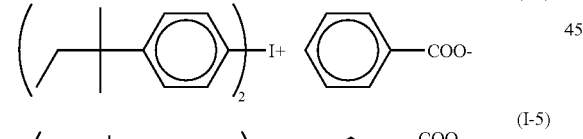
(I-4)

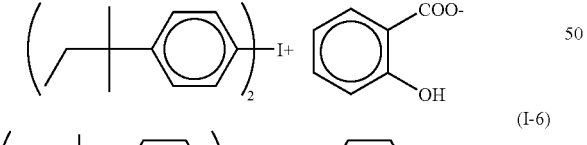
(I-5)

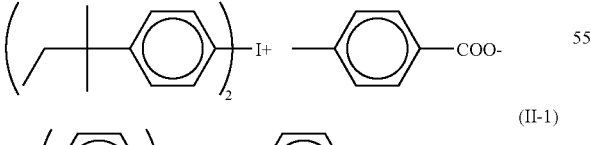
(I-6)

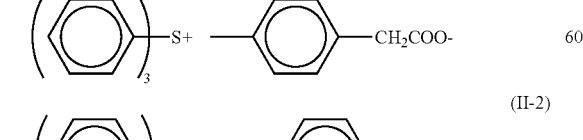
(II-1)

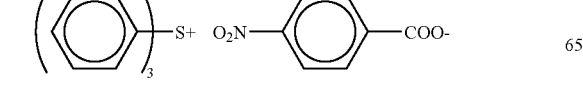
(II-2)

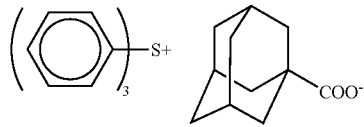
(II-3)

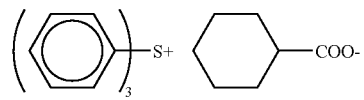
(II-4)

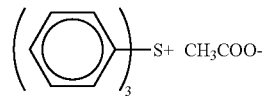
(II-5)

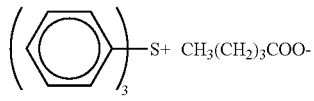
(II-6)

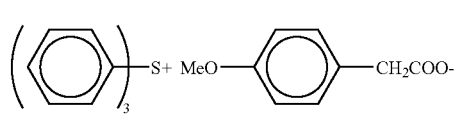
(II-7)

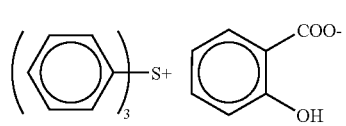
(II-8)

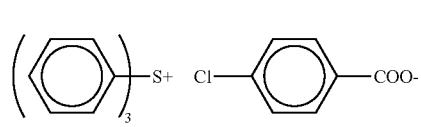
(II-9)

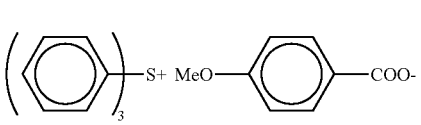
(II-10)

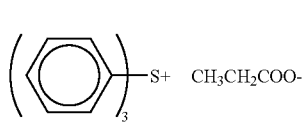
(II-11)

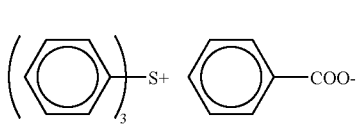
(II-12)

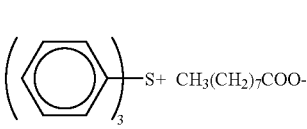
(II-13)

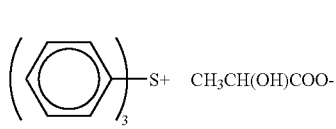
(II-14)

-continued
(II-15)
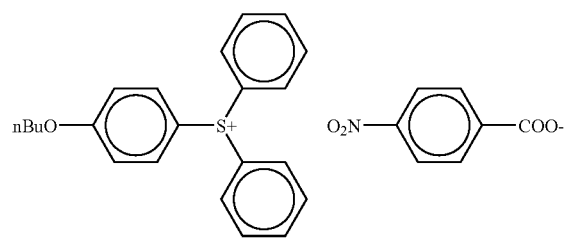
(II-16)
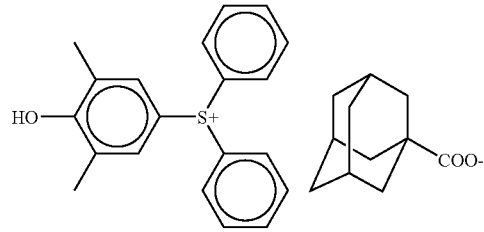
(II-17)
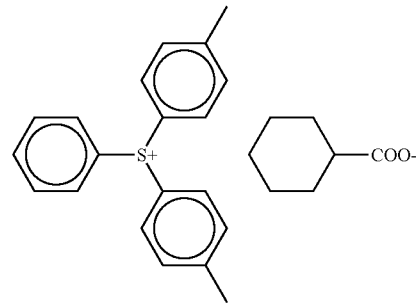
(II-18)
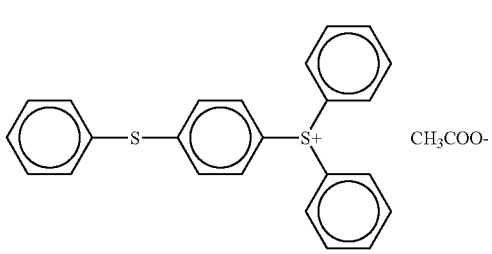
(II-19)
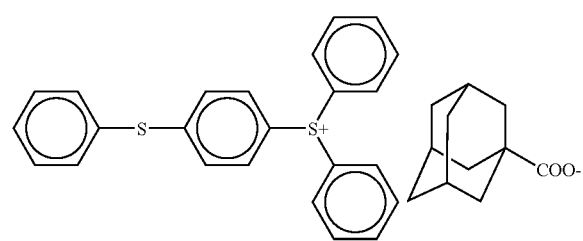
(II-20)
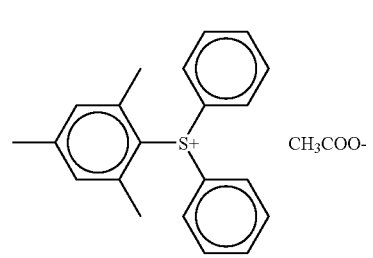
-continued
(III-1)
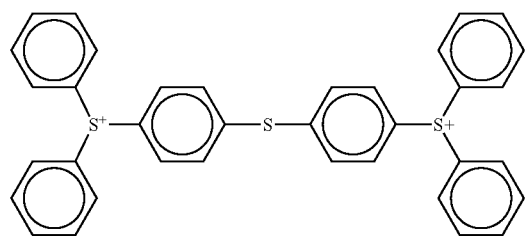
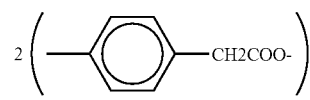
(III-2)
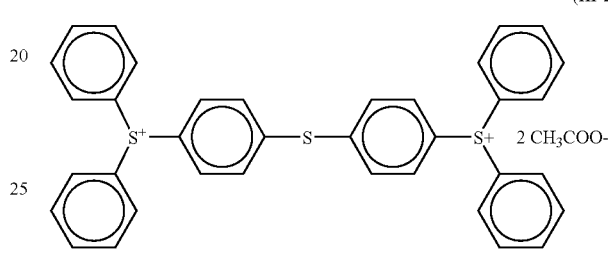
(IV-1)
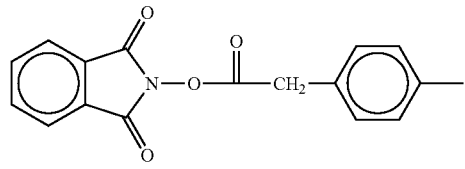
(IV-2)
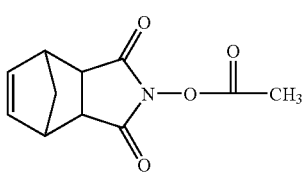
(IV-3)
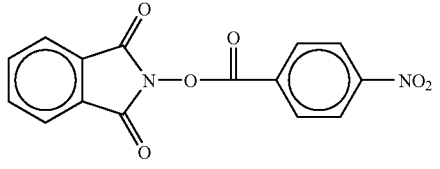
(IV-4)
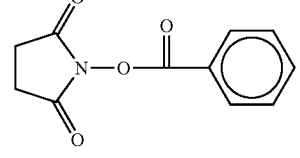
(V-1)
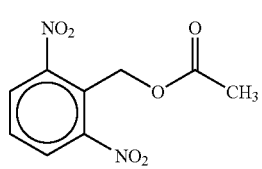

-continued

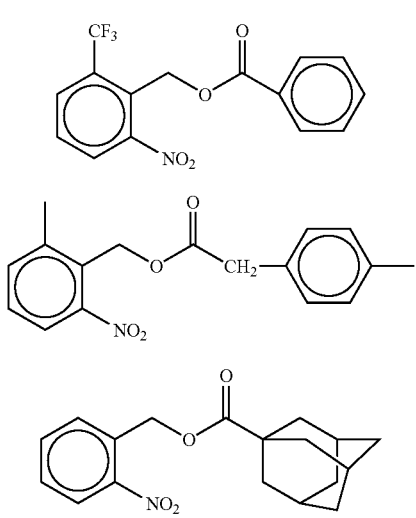

(V-2)

(V-3)

(V-4)

The photo-acid generators described above, i.e., the compounds represented by general formulae (AI), (AII), and (AIII), can be synthesized by using, e.g., the method described in U.S. Pat. No. 3,734,928 or the method described in *Macromolecules*, Vol. 10, 1307(1977), *Journal of Organic Chemistry*, Vol. 55, 4222(1990), or *J. Radiat. Curing*, Vol. 5(1), 2(1978), and then replacing the counter anion. The compounds represented by general formulae (AIV) and (AV) can be obtained by reacting an N-hydroxyimide compound with a carboxylic acid chloride under basic conditions or by reacting nitrobenzyl alcohol with a carboxylic acid chloride under basic conditions.

The ratio of the amount of compound B1 to that of compound B2 to be added is generally from 1/1 to 50/1, preferably from 1/1 to 10/1, especially preferably from 2/1 to 5/1, by weight.

The total amount of compound B1 and compound B2 is generally from 0.5 to 20% by weight, preferably from 0.75 to 15% by weight, more preferably from 1 to 10% by weight, based on all solid components of the composition.

Compound B1 and compound B2 each may consist of two or more compounds.

[3] Solvent (Ingredient C)

The composition of the invention is preferably dissolved in a solvent in which the ingredients described above dissolve, before being applied to a substrate. Preferred examples of the solvent to be used here include 1-methoxy-2-propanol acetate (propylene glycol monomethyl ether acetate), 1-methoxy-2-propanol (propylene glycol monomethyl ether), ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monoethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. Especially preferred are 1-methoxy-2-propanol acetate and 1-methoxy-2-propanol. These solvents may be used alone or as a mixture of two or more thereof. In the case of using a mixture, it is preferred that the mixture should contain either 1-methoxy-2-propanol acetate or 1-methoxy-2-propanol.

[4] Surfactant (Ingredient D)

The positive resist composition of the invention preferably further contains (D) any one of or two or more of fluorochemical and/or silicone surfactants (fluorochemical surfactants, silicone surfactants, and surfactants containing both fluorine atoms and silicon atoms).

When the positive resist composition of the invention contains the surfactant (D), it can show satisfactory sensitivity and resolution when irradiated with an exposure light having a wavelength of 250 nm or shorter, especially 220 nm or shorter, and give a resist pattern having satisfactory adhesion and reduced in development defects.

Examples of those surfactants (D) include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and EF303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troysol S-366 (manufactured by Troy Chemical Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly (blocks of oxyethylene, oxypropylene, and oxyethylene) or poly(blocks of oxyethylene and oxypropylene) group. The copolymer of a monomer having a fluoroaliphatic group with a poly (oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene) acrylate (or methacrylate), a copolymer of an acrylate (or methacrylate) having a $C_6F_{13}$ group with poly(oxyethylene) acrylate (or methacrylate) and poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with poly(oxyethylene) acrylate (or methacrylate) and poly(oxypropylene) acrylate (or methacrylate).

The amount of the surfactant (D) to be used is preferably from 0.0001 to 2% by weight, more preferably from 0.001 to 1% by weight, based on the total amount of the positive resist composition (excluding the solvent).

[5] Acid Diffusion Inhibitor (E)

An acid diffusion inhibitor is preferably added to the composition of the invention for the purposes of: preventing performance fluctuations (formation of T-top pattern contours, sensitivity fluctuations, pattern line width fluctuations, etc.) which may occur with time after irradiation with actinic rays or a radiation until heat treatment; preventing performance fluctuations with time after application; and preventing the excess diffusion of an acid during heat treatment after irradiation with actinic rays or a radiation (deterioration of resolution). This acid diffusion inhibitor is an organic basic compound, e.g., an organic basic compound containing basic nitrogen. It is preferred to use such a compound whose conjugate acid has a $pK_a$ of 4 or higher.

Examples thereof include structures represented by the following formulae (A) to (E).

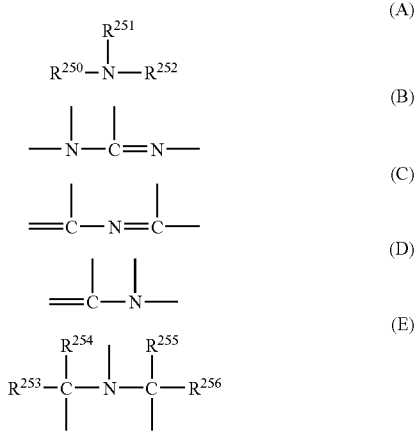

In the formulae, $R^{250}$, $R^{251}$, and $R^{252}$ may be the same or different and each represent a hydrogen atom, an alkyl group having 1 to 20 carbon atoms, an aminoalkyl group having 1 to 20 carbon atoms, a hydroxyalkyl group having 1 to 20 carbon atom, or a substituted or unsubstituted aryl group having 6 to 20 carbon atoms, provided that $R^{251}$ and $R^{252}$ may be bonded to each other to form a ring.

$R^{253}$, $R^{254}$, $R^{255}$, and $R^{256}$ may be the same or different and each represent an alkyl group having 1 to 6 carbon atoms.

Preferred compounds are nitrogen-containing basic compounds having per molecule two or more nitrogen atoms differing in chemical environment. Especially preferred are compounds containing both a substituted or unsubstituted amino group and a cyclic structure containing one or more nitrogen atoms and compounds having an alkylamino group.

Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents are amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano.

Especially preferred examples of these compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the basic compounds should not be construed as being limited to these examples.

Those nitrogen-containing basic compounds may be used alone or in combination of two or more thereof.

The proportion of the acid generator to the organic basic compound in the composition is preferably such that the (acid generator)/(organic basic compound) molar ratio is in the range of from 2.5 to 300. When this molar ratio is less than 2.5, there are cases where the composition has reduced sensitivity and reduced resolution. When the ratio exceeds 300, there are cases where the resist pattern line width becomes large with time after exposure until heat treatment and resolution also becomes poor. The (acid generator)/(organic basic compound) molar ratio is preferably from 5.0 to 200, more preferably from 7.0 to 150.

[6] Non-Polymeric Dissolution Inhibitor (X)

It is especially preferred that the positive resist composition of the invention should further contain a non-polymeric dissolution inhibitor. The term "non-polymeric dissolution inhibitor" as used herein means a compound which has a molecular weight of 3,000 or lower, has at least two acid-dissociable groups, and comes to have enhanced solubility in an alkaline developing solution by the action of an acid. Especially preferred from the standpoint of transparency is one whose frame work has been substituted with one or more fluorine atoms.

The amount of the non-polymeric dissolution inhibitor to be added is preferably from 3 to 50% by weight, more preferably from 5 to 40% by weight, even more preferably from 7 to 30% by weight, based on the polymer in the composition. Addition of ingredient (X) further improves sensitivity and contrast.

Examples of ingredient (X) are shown below, but ingredient (X) for use in the invention should not be construed as being limited to these examples.

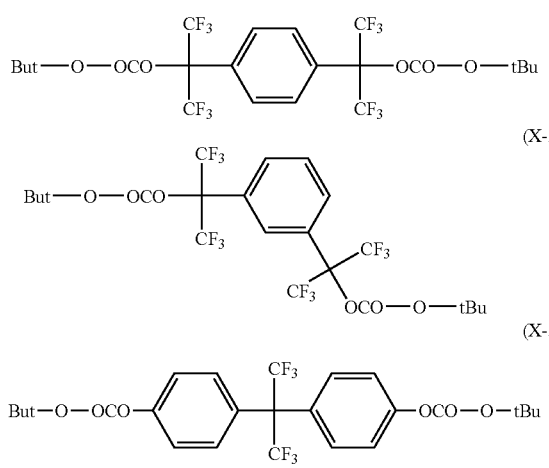

In the production of precision integrated-circuit elements or in similar processes, the step of resist pattern formation on a substrate can be conducted in the following manner. The photosensitive resin composition of the invention is applied to a substrate (e.g., a silicon substrate coated with silicon dioxide or a transparent substrate such as a glass substrate or ITO substrate). The resultant coating is irradiated with actinic rays or a radiation using a drawing apparatus and then subjected to heating, development, rinsing, and drying. Thus, a satisfactory resist pattern can be formed.

As an alkaline developing solution for the positive resist composition of the invention can be used an aqueous solution of an alkali such as an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide, tetraethylammonium hydroxide, or choline, or a cyclic amine, e.g., pyrrole or piperidine. It is also possible to use a developing solution prepared by adding an appropriate amount of an alcohol, e.g., isopropyl alcohol, or a surfactant, e.g., a nonionic one, to an aqueous solution of any of those alkalis.

Preferred of those developing solutions are aqueous solutions of quaternary ammonium salts. More preferred is an aqueous solution of tetramethylammonium hydroxide or choline.

The alkali concentration of the alkaline developing solution is generally from 0.1 to 20% by weight, preferably from 0.2 to 15% by weight, more preferably from 0.5 to 10% by weight.

The pH of the alkaline developing solution is generally from 10.0 to 15.0, preferably from 10.5 to 14.5, more preferably from 11.0 to 14.0.

EXAMPLES

The invention will be explained below in greater detail by reference to Examples, but the contents of the invention should not be construed as being limited to the following Examples.

Synthesis Example (1) Synthesis of Intermediate (M-1)

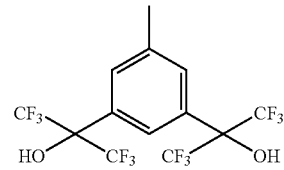

Sixty grams of fuming sulfuric acid was mixed with 55.84 g (0.22 mol) of iodine. This mixture was heated to 60° C., and 82.03 g (0.2 mol) of 1,3-bis(2-hydroxyhexafluoroisopropyl)benzene was added dropwise thereto with stirring over 1 hour. After the dropwise addition, the mixture was further stirred for 3 hours, subsequently neutralized with an aqueous sodium hydroxide solution, and then extracted with ethyl acetate. The organic layer was dehydrated with 30 g of magnesium sulfate, and the solvent was distilled off. Thereafter, the reaction product was purified by silica gel chromatography to obtain 50.71 g of intermediate (M-1) (yield, 43%).

(2) Synthesis of Intermediate (M-2)

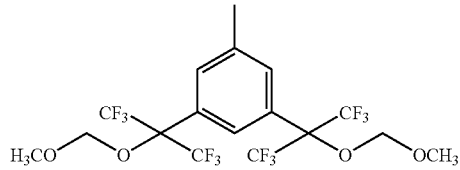

In 80 g of N,N-dimethylacetamide was dissolved 53.61 g (0.1 mol) of intermediate (M-1). Thereto were added 4.4 g (0.11 mol) of sodium hydroxide and 19.32 g (0.24 mol) of chloromethyl methyl ether. The resultant mixture was heated to 100° C. and stirred for 3 hours. After the mixture was cooled to room temperature, it was neutralized with 0.1 N aqueous HCl solution and then washed and extracted with ethyl acetate/water. The organic layer was dehydrated with 20 g of anhydrous sodium sulfate, and the solvent was distilled off. Thereafter, the reaction product was purified by silica gel chromatography to obtain 48.68 g of intermediate (M-2) (yield, 78%).

(3) Monomer (A) Synthesis (1)

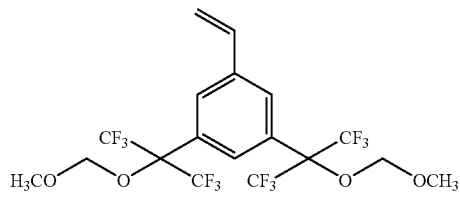

In 50 g of dehydrated tetrahydrofuran was dissolved 31.2 g (0.05 mol) of intermediate (M-2). The atmosphere in the system was replaced with nitrogen. To the solution were added nickel(II) chloride and triphenylphosphine in amounts of 5 mol % and 10 mol %, respectively, based on the intermediate (M-2). This mixture was stirred. Thereto was added 50 mL of vinylmagnesium bromide (1.0 M tetrahydrofuran solution). The resultant mixture was heated to 60° C. and stirred for 4 hours. After the mixture was cooled to room temperature, it was washed and extracted with ethyl acetate/water. The organic layer was dehydrated with 20 g of anhydrous sodium sulfate, and the solvent was distilled off. Thereafter, the reaction product was purified by silica gel chromatography to obtain 17.30 g of monomer (A) (yield, 66%).

(4) Synthesis of Intermediate (M-3)

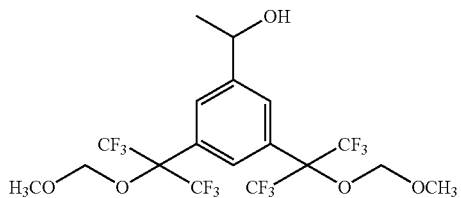

Into a dried reaction vessel was introduced 1.22 g (0.05 mol) of magnesium (flakes). The atmosphere in the system was replaced with nitrogen. Thereto was added 20 mg of 1,2-dibromoethane. After the mixture was sufficiently stirred, 31.2 g (0.05 mol) of intermediate (M-2) and 50 g of dehydrated tetrahydrofuran were gradually added dropwise thereto. After the dropwise addition, the mixture was continuously stirred until heat generation came not to occur any more. Thereafter, a solution of 6.60 g (0.15 mol) of acetaldehyde in 20 g of dehydrated tetrahydrofuran was added thereto, and the resultant mixture was stirred for 2 hours. Subsequently, the mixture was neutralized with saturated aqueous ammonium chloride solution and then extracted with ethyl acetate/water. The organic layer was dehydrated with 10 g of anhydrous sodium sulfate, and the solvent was distilled off to obtain 20.61 g of intermediate (M-3) (yield, 76%).

(5) Monomer A Synthesis (2)

In 20 g of tetrahydrofuran was dissolved 20.61 g (0.03 mol) of intermediate (M-3). A solution of 5.72 g (0.03 mol) of p-toluenesulfonyl chloride in 15 g of tetrahydrofuran and 4.05 g (0.04 mol) of triethylamine were added dropwise thereto. After the dropwise addition, the mixture was stirred for 2 hours. Thereafter, 0.1 g of p-methoxyphenol and 9.13 g (0.06 mol) of 1,8-diazabicyclo[5.4.0]undec-7-ene (DBU) were added thereto. This mixture was heated to 65° C. and stirred for 1 hour. Subsequently, the mixture was neutralized with 0.1 N aqueous HCl solution. After the resultant salt was separated by filtration, the reaction mixture was extracted with ethyl acetate/water. The organic layer was dehydrated with 10 g of anhydrous sodium sulfate, and the solvent was distilled off to obtain 8.97 g of monomer (A) (yield, 57%).

(6) Synthesis of Monomer (B)

In 40 g of a solution consisting of tetrahydrofuran, methanol, and 0.1 N aqueous HCl solution (2/2/1 by weight) was dissolved 15.73 g (0.03 mol) of monomer (A). The resultant solution was stirred at room temperature for 1 hour. Thereafter, the solution was neutralized with an aqueous sodium hydroxide solution and extracted with ethyl acetate/water. The organic layer was dehydrated with 20 g of magnesium sulfate, and the solvent was distilled off to obtain 12.17 g of monomer (B) (yield, 93%).

(7) Synthesis of Polymer (A-1)

In 70 g of tetrahydrofuran were dissolved 43.62 g (0.1 mol) of monomer (A) and 17.23 g (0.0563 mol) of an α-trifluoromethyl acrylic-3,5-dihydroxy-1-adamantyl ester. After the atmosphere in the system was replaced with nitrogen, 1.16 g (0.156 mol) of polymerization initiator V-65 (manufactured by Wako Pure Chemical Industries, Ltd.) was added and the reaction mixture was heated at 65° C. for 8 hours while passing nitrogen through the reaction system. Thereafter, the reaction mixture was cooled to room temperature and dropped into 1.5 L of hexane. The resultant particles were taken out by filtration and vacuum-dried at 100° C. to obtain 41.38 g of a powder (yield, 68%). The weight-average molecular weight and dispersity ratio of the powder obtained, as determined by gel permeation chromatography (GPC), were found to be 10,800 and 1.42, respectively. Analysis by $^{13}$C-NMR spectroscopy revealed that the monomer unit ratio of monomer (A)/α-trifluoromethyl-3,5-dihydroxy-1-adamantyl ester was 64/36.

The same procedure as described was conducted, except that the monomers to be added were changed. Thus, polymers (A-2) to (A-13) were obtained. In Table 1 are shown the monomer unit ratio, molecular weight, and dispersity ratio of each polymer. The structures of the monomers used are shown below.

TABLE 1

| Polymer | Monomer unit ratio (in the order of left to right in the following formulae) | Weight-average molecular weight | Dispersity ratio |
|---|---|---|---|
| (A-1) | 64/36 | 10800 | 1.42 |
| (A-2) | 65/35 | 11200 | 1.39 |
| (A-3) | 59/41 | 9900 | 1.41 |
| (A-4) | 56/44 | 10500 | 1.37 |
| (A-5) | 62/38 | 11600 | 1.39 |
| (A-6) | 77/23 | 10900 | 1.4 |
| (A-7) | 61/39 | 12400 | 1.41 |
| (A-8) | 53/26/21 | 11100 | 1.37 |
| (A-9) | 45/35/20 | 11500 | 1.42 |
| (A-10) | 52/30/18 | 8800 | 1.36 |
| (A-11) | 55/23/22 | 9700 | 1.38 |
| (A-12) | 20/16/64 | 10400 | 1.42 |
| (A-13) | 37/33/30 | 11600 | 1.41 |

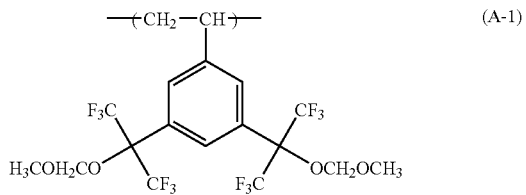

(A-1)

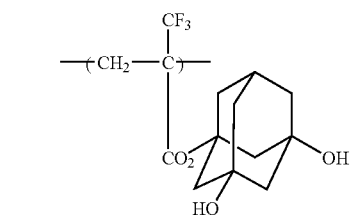

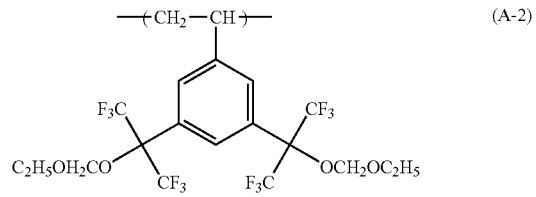

(A-2)

TABLE 1-continued
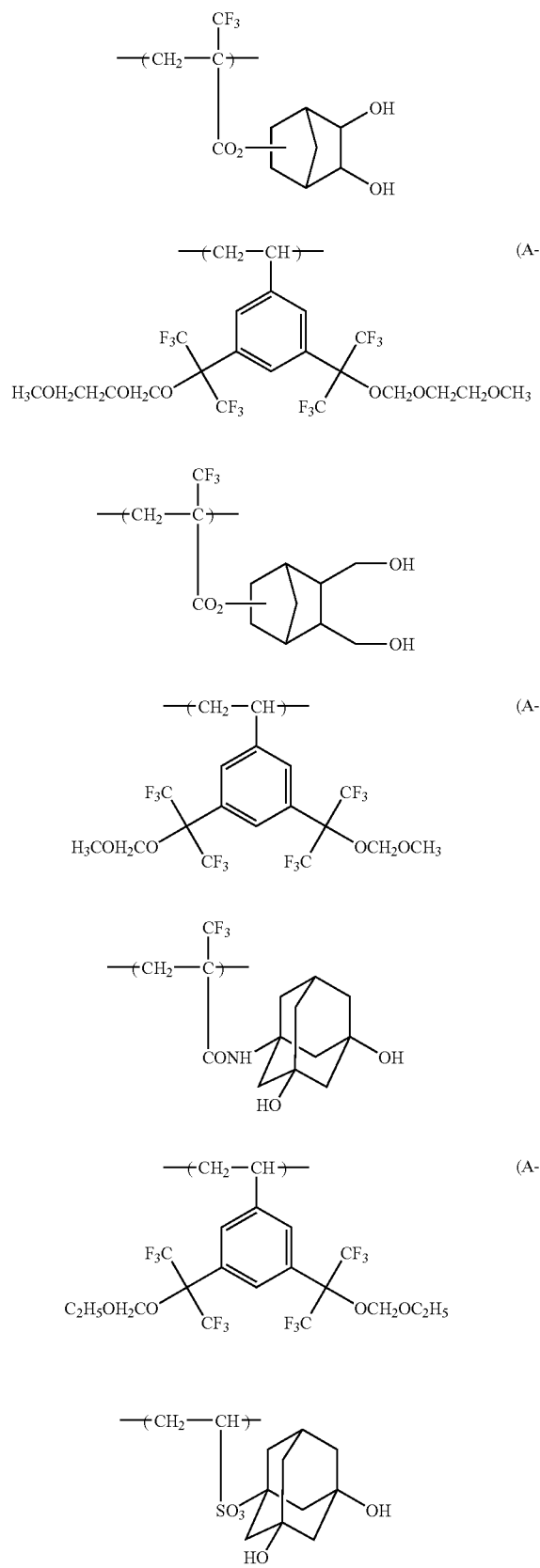
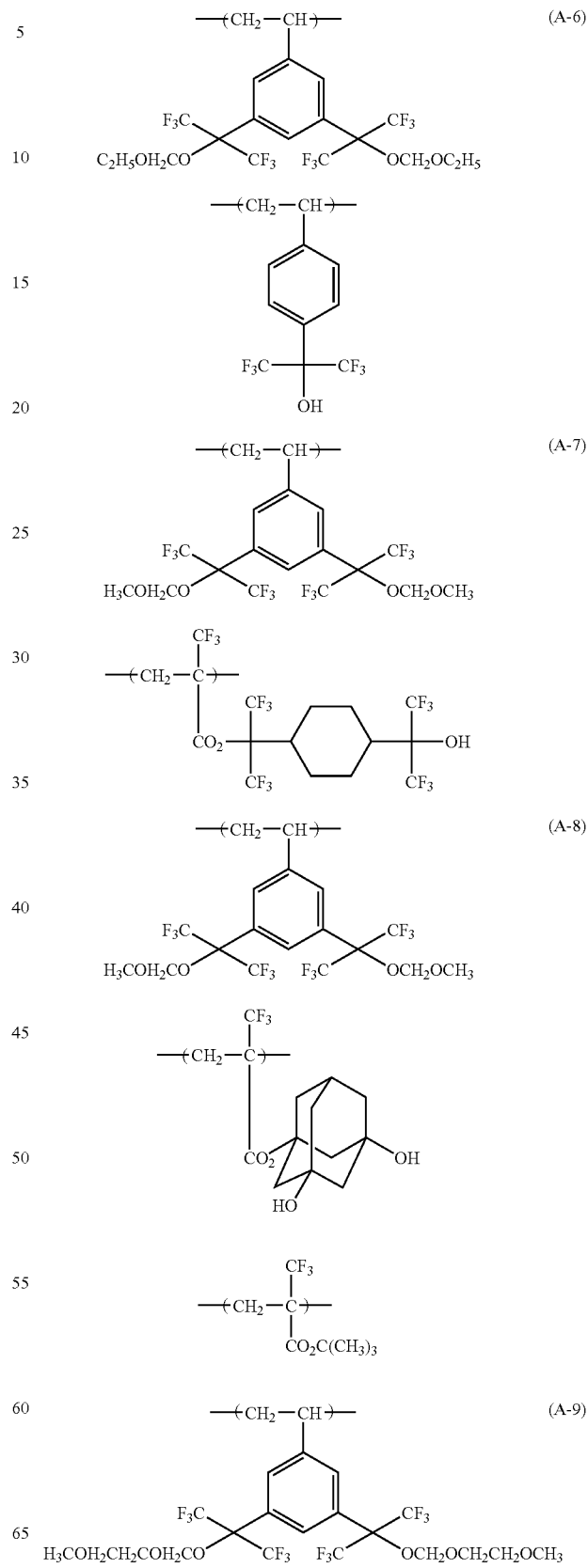

TABLE 1-continued
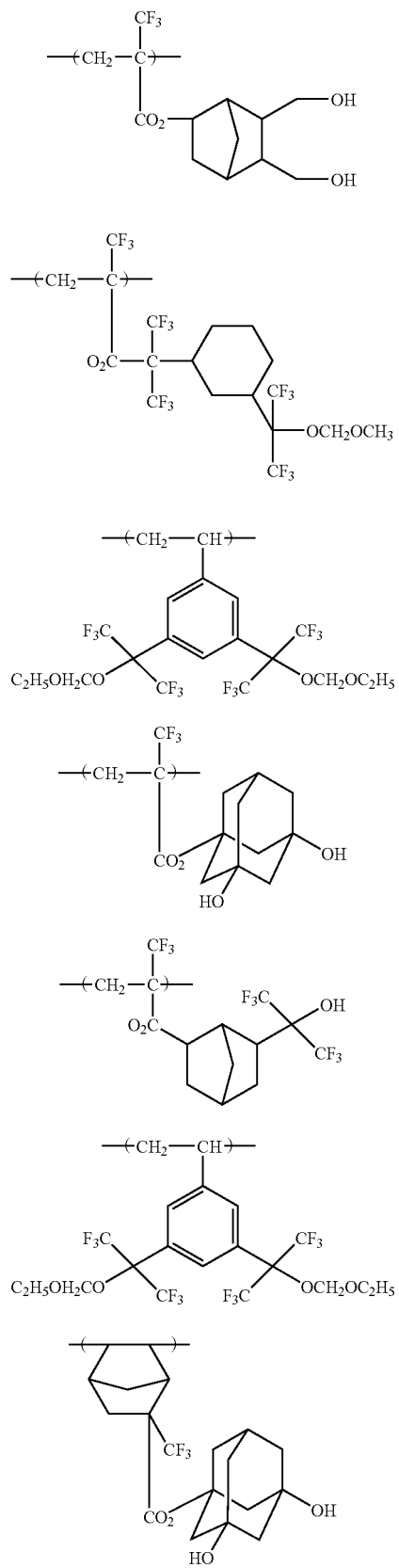
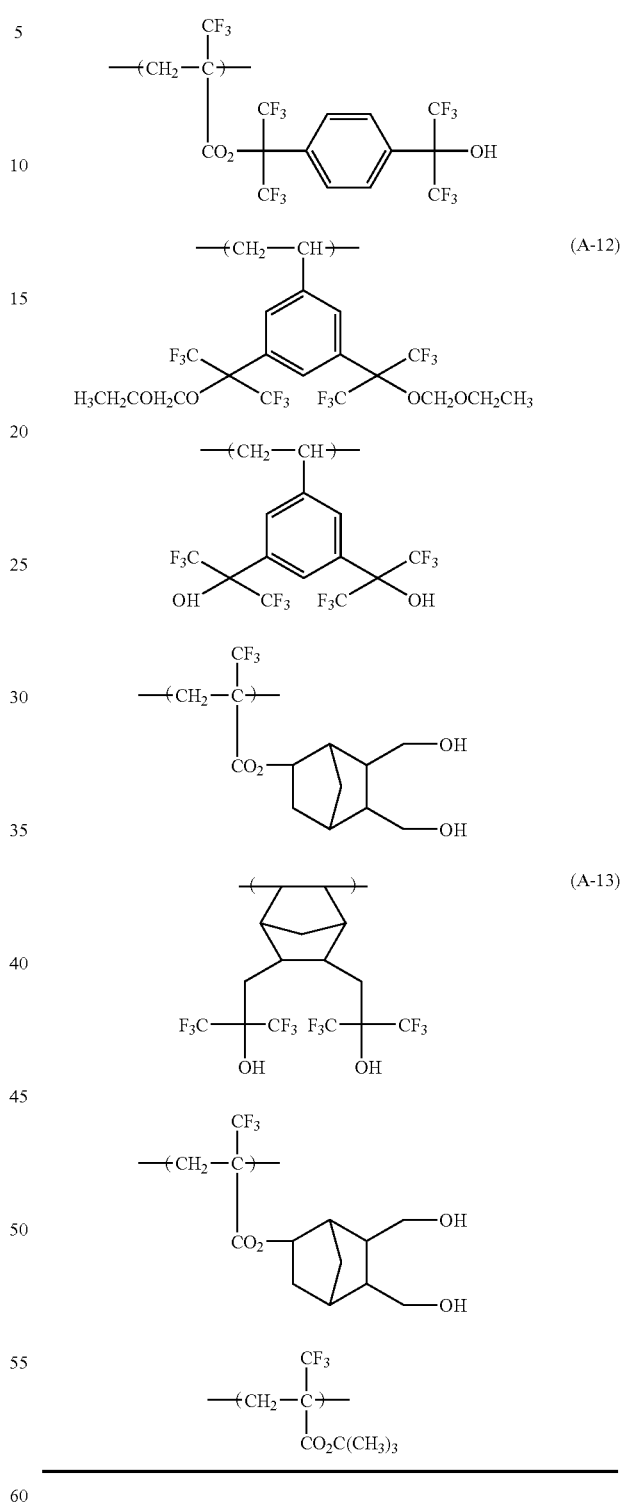
Example 1
<Measurement of Transmittance>
In 25 g of propylene glycol monomethyl ether acetate was dissolved 1.36 g of each of polymers (A-1) to (A-13) and comparative polymers (1) and (2). Each solution was filtered through a 0.1-μm Teflon filter and then applied to a calcium fluoride disk with a spin coater, and the coating was dried by heating at 120° C. for 5 minutes to obtain a film having a thickness of 0.1 μm. These coating films were examined for absorption with spectrometer Acton CAMS-507, and the transmittance at 157 nm of each film was calculated.

The results obtained are shown in Table 2.

TABLE 2

| Polymer | Transmittance at 157 nm (%), film thickness 0.1 μm |
|---|---|
| (A-1) | 66 |
| (A-2) | 65 |
| (A-3) | 69 |
| (A-4) | 64 |
| (A-5) | 68 |
| (A-6) | 68 |
| (A-7) | 71 |
| (A-8) | 64 |
| (A-9) | 66 |
| (A-10) | 63 |
| (A-11) | 64 |
| (A-12) | 66 |
| (A-13) | 63 |
| Comparative polymer (1) | 25 |
| Comparative polymer (2) | 24 |

Comparative Polymer (1); weight-average molecular weight, 8,500

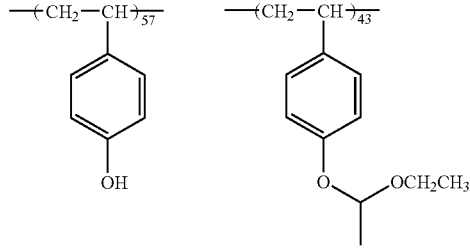

TABLE 2-continued

Comparative Polymer (2); weight-average molecular weight, 8,400

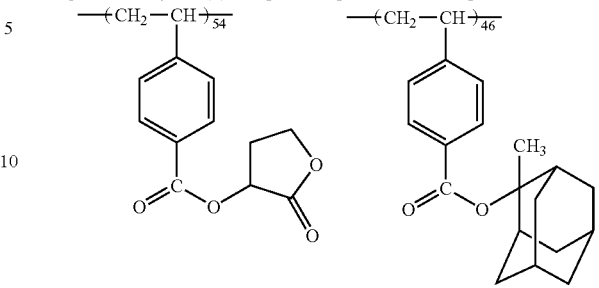

It can be seen that the coating films formed from the compositions according to the invention have a sufficiently high transmittance at 157 nm.

<Evaluation of Film Thickness Evenness>

In 19.6 g of propylene glycol monomethyl ether acetate were dissolved 1.2 g of each of resins (A-1) to (A-13) and comparative polymer (3) and 0.06 g of triphenylsulfonium nonafluorobutanesulfonate. Each solution was filtered through a 0.1-μm Teflon filter.

Each of the photosensitive compositions thus obtained was applied with a spin coater to a silicon wafer treated with hexamethyldisilazane, and the coating was dried by heating at 120° C. for 60 seconds. Thereafter, the thickness of each film was measured with an interference film thickness meter at five points on the wafer. Thus, resist films each having an average thickness of 0.1 μm were formed. The difference between the maximum and the minimum among the thickness values found at the five points was calculated, and was taken as an index to film thickness evenness.

The results obtained are shown in Table 3.

TABLE 3

| Polymer | Film thickness evenness (nm) |
|---|---|
| (A-1) | 3.4 |
| (A-2) | 3.6 |
| (A-3) | 3.5 |
| (A-4) | 3.2 |
| (A-5) | 4 |
| (A-6) | 3.8 |
| (A-7) | 3.6 |
| (A-8) | 3.1 |
| (A-9) | 3.5 |
| (A-10) | 3.7 |
| (A-11) | 3.3 |
| (A-12) | 3.5 |
| (A-13) | 3.6 |
| Comparative polymer (3) | 15.3 |

Comparative Polymer (3); weight average molecular weight, 9,700

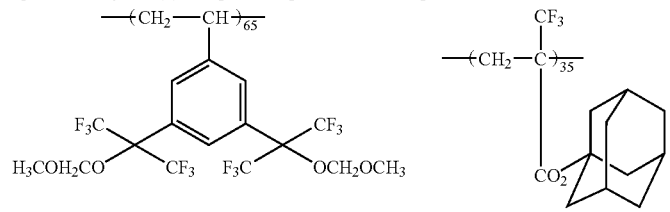

It can be seen from the results given above that sufficient evenness in thickness is obtained by using the compositions according to the invention.

<Evaluation of Dry Etching Resistance>

In 25 g of propylene glycol monomethyl ether acetate was dissolved 3.2 g of each of resins (A-1) to (A-13) according to the invention and comparative polymer (3). Each solution was filtered through a 0.1-μm Teflon filter. Each sample solution was applied with a spin coater to a silicon wafer treated with hexamethyldisilazane, and the coating was dried by heating at 120° C. for 60 seconds to form a 0.5-μm resist film. This resist film was etched with an etching apparatus using $CHF_3/O_2$=16/4 as an etchant gas under the conditions of a pressure of 20 mTorr and an applied power of 100 $mW/cm^3$. The etching rate of each of these resist films was determined from the film thickness change of the resist. Under the same conditions, the etching rate of a resist film formed from a cresol novolak (m/p ratio=4/6; weight-average molecular weight, 5,000) was determined. The ratio of [the etching rate of the film of each Example or Comparative Example]/[the etching rate of the cresol novolak film] was calculated. Furthermore, a section and surface of each sample obtained were examined and evaluated based on the following criteria.

A: Almost no irregularities are observed on the resist surface.

B: Irregularities are slightly observed on the resist surface.

C: Considerable irregularities are observed on the resist surface.

The results obtained are shown in Table 4.

TABLE 4

| Polymer | Etching rate ratio | Surface after etching |
|---|---|---|
| A1 | 1.17 | A |
| A2 | 1.13 | A |
| A3 | 1.14 | A |
| A4 | 1.17 | A |
| A5 | 1.15 | A |
| A6 | 1.14 | A |
| A7 | 1.12 | A |
| AB | 1.14 | A |
| A9 | 1.16 | A |
| A10 | 1.13 | A |
| A11 | 1.15 | A |
| A12 | 1.19 | A |
| A13 | 1.20 | A |
| Comparative polymer (3) | 1.48 | C |

It can be seen from the results given above that the coating films formed from the compositions according to the invention show satisfactory resistance to dry etching and further have a satisfactory surface shape after the etching.

<Image Evaluation>

Polymer solutions were prepared from the ingredients shown in Table 5. Specifically, 1.2 g of a polymer, 0.030 g of an acid generator, a surfactant in an amount of 100 ppm of polymer solution, 0.0012 g of an organic basic compound, and 0.24 g of a non-polymeric dissolution inhibitor were dissolved in 19.6 g of a solvent to prepare a polymer solution. The polymer solutions thus obtained were filtered through a 0.1-μm Teflon filter to prepare positive resist fluids.

TABLE 5

| Example | Resin | Acid generator (weight ratio) | Solvent (weight ratio) | Non-polymeric dissolution inhibitor | Basic compound | Surfactant |
|---|---|---|---|---|---|---|
| 1 | (A-1) | (VII-1) | S-2 | — | N-3 | W-1 |
| 2 | (A-2) | (VII-1)/(PAG4-4) 95/5 | S-2 | — | N-2 | W-1 |
| 3 | (A-3) | (VII-4) | S-2/S-3 (80/20) | — | N-1 | W-2 |
| 4 | (A-4) | (VII-14) | S-2 | (X-1) | N-2 | W-1 |
| 5 | (A-5) | (VII-1)/(PAG4-1) 95/5 | S-2/S-1 (80/20) | — | N-2 | W-2 |
| 6 | (A-6) | (VII-4) | S-2 | (X-2) | N-3 | W-2 |
| 7 | (A-7) | (VII-4)/(II-4f) 90/10 | S-2 | — | N-2 | W-1 |
| 8 | (A-8) | (VII-14) | S-2 | — | N-1 | W-2 |
| 9 | (A-9) | (VII-4)/(PAG4-34) 95/5 | S-2/S-3 (80/20) | — | N-3 | W-1 |
| 10 | (A-10) | (VII-1)/(I-3f) 95/5 | S-2 | — | N-1 | W-1 |
| 11 | (A-11) | (PAG4-4) | S-2 | (X-3) | N-2 | W-2 |
| 12 | (A-12) | (VII-1) | S-2 | — | N-3 | W-1 |
| 13 | (A-13) | (VII-4) | S-2/S-3 (80/20) | — | N-1 | W-2 |

TABLE 5-continued

| Compar-ative Example | | | | | | |
|---|---|---|---|---|---|---|
| 1 | Compar-ative resin (3) | (VII-1) | S-2 | — | N-3 | W-1 |
| 2 | Compar-ative resin (4) | (VII-1) | S-2 | — | N-3 | W-1 |

N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (manufactured by Dainippon Ink & Chemicals, Inc.) (fluorochemical)
W-2: Megafac R08 (manufactured by Dainippon Ink & Chemicals, Inc.) (fluorochemical and silicone)
S-1: Methyl lactate
S-2: Propylene glycol monomethyl ether acetate
S-3: Propylene glycol monomethyl ether
Comparative Polymer (4); weight-average molecular weight, 10,100

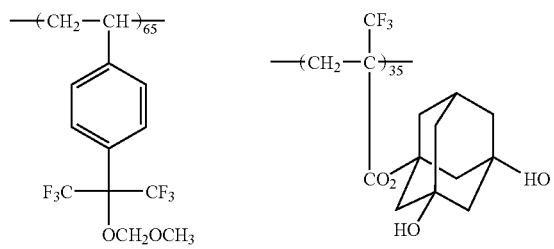

Each of the positive resist fluids prepared above was evenly applied with a spin coater to a silicon wafer coated with an antireflection film (DUV42-6, manufactured by Brewer Science Inc.). The resist fluid applied was dried by heating at 120° C. for 60 seconds to form a positive resist film having a thickness of 0.1 μm. This resist film was pattern-wise exposed with a KrF micro stepper through a line-and-space mask (line width, 150 nm; line/space=1/1). Immediately after the exposure, the resist film was heated on a 130° C. hot plate for 90 seconds. Thereafter, the resist film was developed with a 2.38% by weight aqueous solution of tetramethylammonium hydroxide at 23° C. for 60 seconds, subsequently rinsed with pure water for 30 seconds, and then dried. The pattern thus obtained on the silicon wafer was evaluated for resist performances by the following methods. The results obtained are shown in Table 6.

[Line Edge Roughness]

In the line pattern, length-direction edges in an area of 5 μm were examined with a length-measuring SEM (S-8840, manufactured by Hitachi, Ltd.) to measure the distance from the standard line where each edge was to be present. This measurement was made on 50 points. A standard deviation was determined and 3σ was calculated. The smaller the value thereof, the better the performance.

[Scum Generation]

The resist pattern having a line width of 150 nm was examined for the presence of development residues (scum). The resist patterns on which no residues were observed are rated as A, those on which residues were slightly observed are rated as B, and those on which many residues were observed are rated as C.

TABLE 6

| | Edge roughness (nm) | Scum |
|---|---|---|
| Example 1 | 10.3 | A |
| Example 2 | 10.1 | A |
| Example 3 | 10.6 | A |
| Example 4 | 10.4 | A |
| Example 5 | 10.2 | A |
| Example 6 | 10.3 | A |
| Example 7 | 10.7 | A |
| Example 8 | 10.6 | A |
| Example 9 | 10.1 | A |
| Example 10 | 10.2 | A |
| Example 11 | 10.5 | A |
| Example 12 | 10.3 | A |
| Example 13 | 10.4 | A |
| Comparative Example 1 | 16.7 | C |
| Comparative Example 2 | 14.3 | C |

It can be seen from the results given above that the compositions according to the invention are satisfactory in line edge roughness diminution and developability.

The positive resist composition of the invention is sufficiently transparent and is excellent in evenness of application, resistance to dry etching, line edge roughness diminution, and developability.

The entire disclosure of each and every foreign patent application from which the benefit of foreign priority has been claimed in the present application is incorporated herein by reference, as if fully set forth.

What is claimed is:

1. A positive resist composition comprising:

(A) a resin which comprises a repeating unit having at least two groups represented by the following general formula (Z) and at least one repeating unit selected from the group consisting of repeating units represented by the following general formulae (II) to (V), the resin increasing the solubility in an alkaline developing solution by the action of an acid; and (B) at least one compound which generates an acid by the action of actinic rays or a radiation:

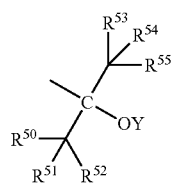

(Z)

in general formula (Z), $R^{50}$ to $R^{55}$ each independently represents a hydrogen atom, a fluorine atom, or an alkyl group, provided that at least one of $R^{50}$ to $R^{55}$ is either a fluorine atom or an alkyl group in which at least one of the hydrogen atoms has been replaced by a fluorine atom, and Y's each independently represent a hydrogen atom or an organic group;

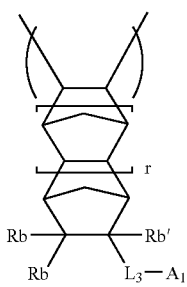

(II)

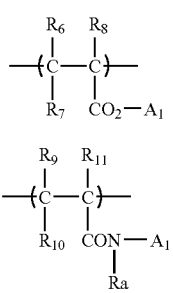

(III)

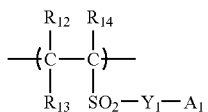

(IV)

in general formula (II),

Rb and Rb' each independently represents a hydrogen atom, a halogen atom, or an organic group, $L_3$ represents a single bond or a bivalent connecting group, $A_1$ represents a partial structure represented by the following general formula ($A_1$), and r represents 0 or 1;

in general formula (III), $R_6$ to $R_8$ each independently represents a hydrogen atom, a fluorine atom, a chlorine atom, a cyano group, or an alkyl group in which at least one of the hydrogen atoms has been replaced by a fluorine atom, provided that at least one of $R_6$ to $R_8$ is not a hydrogen atom, and $A_1$ represents a partial structure represented by tile following general formula ($A_1$);

in general formula (IV), $R_9$ to $R_{11}$ each independently represents a hydrogen atom, a fluorine atom, a chlorine atom, a cyano group, or an alkyl group in which at least one of the hydrogen atoms has been replaced by a fluorine atom, provided that at least one of $R_9$ to $R_{11}$ is not a hydrogen atom, Ra represents a hydrogen atom, an alkyl group, a cycloalkyl group, an aryl group, or an aralkyl group, and $A_1$ represents a partial structure represented by the following general formula ($A_1$);

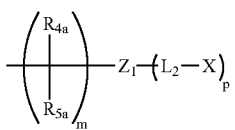

(V)

in general formula (V), $R_{12}$ to $R_{14}$ each independently represents a hydrogen atom, a fluorine atom, a chlorine atom, a cyano group, or an alkyl group in which at least one of the hydrogen atoms has been replaced by a fluorine atom, $Y_1$, represents a single bond, —O—, or —N(Ra)—, wherein Ra represents a hydrogen atom, an alkyl group, a cycloalkyl group, an aryl group, or an aralkyl group, and $A_1$ represents a partial structure represented by the following general formula ($A_1$); and $$\left(\begin{array}{c}R_{4a}\\|\\|\\R_{5a}\end{array}\right)_m Z_1 \!-\! (L_2 \!-\! X)_p$$

(A$_1$)

in general formula ($A_1$), $R_{4a}$ and $R_{5a}$ each independently represents an alkyl group, $Z_1$ represents an alicyclic hydrocarbon group having a valence of p+1, $L_2$ represents a single bond or a methylene group, X represents a hydroxy group, a cyano group, an alkoxy group, or an alkyl group, provided that at least one of the X's is not an alkyl group, when two or more $L_2$'s and two or more X's are present in the partial structure, the $L_2$'s and the X's each may be the same or different, m represents 0 or 1, and p represents an integer of 1 to 4.

2. The positive resist composition of claim 1, wherein the repeating units having at least two groups represented by general formula (Z) are repeating units represented by the following general formula (I):

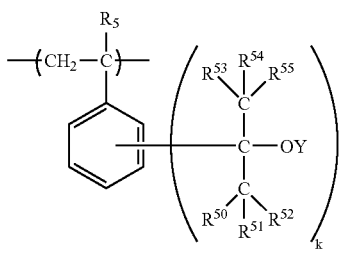

in general formula (I), $R_5$ represents a hydrogen atom, a halogen atom, a cyano group, or an alkyl group, $R^{50}$'s to $R^{55}$'s each independently represent a hydrogen atom, a fluorine atom, or an alkyl group, provided that at least one of $R^{50}$ to $R^{55}$ is either a fluorine atom or an alkyl group in which at least one of the hydrogen atoms has been replaced by a fluorine atom, Y's each independently represent a hydrogen atom or an organic group, and k represents an integer of $2 \leq k \leq 5$.

3. The positive resist composition as described in claim 2 wherein k in formula (I) is 2.

4. The positive resist composition of claim 1, wherein at least one X in the formula ($A_1$) is a group having a hydroxy group.

5. The positive resist composition of claim 1, wherein the resin (A) further contains at least one of repeating units represented by the following formula (VIII) and repeating units represented by the following formula (IX):

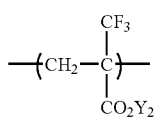

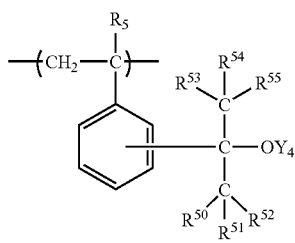

in general formula (VIII), $Y_2$ represents a hydrogen atom or an organic group; and in general formula (IX), $R_5$ represents a hydrogen atom, a halogen atom, a cyano group, or an alkyl group, $R^{50}$ to $R^{55}$ each independently represents a hydrogen atom, a fluorine atom, or an alkyl group, provided that at least one of $R^{50}$ to $R^{55}$ is a fluorine atom or an alkyl group in which at least one of the hydrogen atoms has been replaced by a fluorine atom, and $Y_4$ represents a hydrogen atom or an organic group.

6. The positive resist composition as described in claim 1, wherein $Z_1$, in the formula ($A_1$) is an adamantyl group or a norbornane residue.

7. The positive resist composition as described in claim 1 wherein Rb' in formula (II), $R_8$ in formula (III), or $R_{11}$ in formula (IV) is a trifluoromethyl group.

8. The positive resist composition as described in claim 1, wherein the resin further comprises a repeating unit represented by formula (VI):

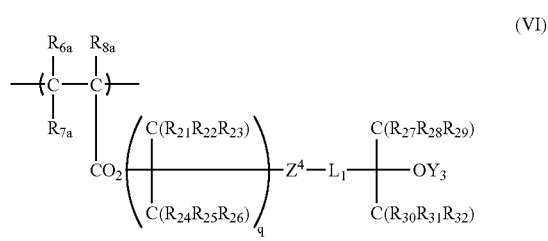

in general formula (VI), $R_{6a}$ to $R_{8a}$ each independently represents a hydrogen atom, a fluorine atom, a chlorine atom, a cyano group, or an alkyl group in which at least one of the hydrogen atoms has been replaced by a fluorine atom, provided that at least one of $R_{6a}$ to $R_{8a}$ is not a hydrogen atom, $R_{21}$ to $R_{26}$ each independently represents a hydrogen atom, a fluorine atom, or an alkyl group, provided that at least one of $R_{21}$ to $R_{26}$ is a fluorine atom, $R_{27}$ to $R_{32}$ each independently represents a hydrogen atom, a fluorine atom, or an alkyl group, provided that at least one of $R_{27}$ to $R_{32}$ is a fluorine atom, $Z^4$ represents a phenylene group, a cyclohexylene group, an adamantane residue, or a norbornane residue, $Y_3$ represents a hydrogen atom or an organic group, $L_1$ represents a single bond or a bivalent connecting group, and q represents 0 or 1.

9. The positive resist composition as described in claim 1 which further contains (X) a non-polymeric dissolution inhibitor.

10. The positive resist composition as described in claim 1, wherein the compound (B) comprises (B1) at least one compound which generates an organic sulfonic acid by the action of actinic rays or a radiation.

11. The positive resist composition as described in claim 10, wherein the compound (B1) comprises at least one compound which generates an organic sulfonic acid containing at least one fluorine atom by the action of actinic rays or a radiation and at least one compound which generates an organic sulfonic acid containing no fluorine atom by the action of actinic rays or a radiation.

12. The positive resist composition as described in claim 10, wherein the compound (B) further contains (B2) a compound which generates a carboxylic acid by the action of actinic rays or a radiation.

13. The positive resist composition as described in claim 1, which further contains (E) an organic basic compound.

14. The positive resist composition as described in claim 1 which further contains (D) a surfactant.

15. A method of forming a resist pattern comprising:

coating the positive resist composition as described in claim 1 on a substrate;

irradiating a resultant coating with actinic rays or a radiation; and developing the resultant coating.

* * * * *